US012540276B2

(12) United States Patent
Kim et al.

(10) Patent No.: US 12,540,276 B2
(45) Date of Patent: Feb. 3, 2026

(54) QUANTUM DOT, COMPOSITION INCLUDING QUANTUM DOT, QUANTUM DOT COMPOSITE, DISPLAY PANEL, AND ELECTRONIC DEVICE INCLUDING SAME

(71) Applicant: Samsung Electronics Co., Ltd., Suwon-si (KR)

(72) Inventors: Minho Kim, Suwon-si (KR); Tae Gon Kim, Suwon-si (KR); Yebin Jung, Suwon-si (KR); Nayoun Won, Suwon-si (KR); Shin Ae Jun, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 644 days.

(21) Appl. No.: 17/903,242

(22) Filed: Sep. 6, 2022

(65) Prior Publication Data
US 2023/0105598 A1 Apr. 6, 2023

(30) Foreign Application Priority Data
Sep. 13, 2021 (KR) .................. 10-2021-0121899

(51) Int. Cl.
C09K 11/70 (2006.01)
C09K 11/02 (2006.01)
(Continued)

(52) U.S. Cl.
CPC .......... C09K 11/703 (2013.01); C09K 11/025 (2013.01); C09K 11/0883 (2013.01);
(Continued)

(58) Field of Classification Search
None
See application file for complete search history.

(56) References Cited

U.S. PATENT DOCUMENTS 10,246,634 B2  4/2019  Yang et al.
10,723,942 B2  7/2020  Jun et al.
(Continued)

FOREIGN PATENT DOCUMENTS

KR         1187663 B1    10/2012
KR      20170048220 A     5/2017
(Continued)

OTHER PUBLICATIONS

English translation of Kim et al. (KR 2015-0059044). (Year: 2015).*
(Continued)

Primary Examiner — Ronak C Patel
(74) Attorney, Agent, or Firm — CANTOR COLBURN LLP

(57) ABSTRACT

A quantum dot including a core including a first semiconductor nanocrystal, and a shell disposed on the core, the shell including a second semiconductor nanocrystal, wherein the quantum dot includes a metal including indium and zinc, and a non-metal including phosphorus and sulfur, does not include cadmium, and has an optical density (OD) of about 0.4 to about 0.6 per 1 milligrams (mg) of the quantum dot for a wavelength of 450 nanometers (nm) and an emission peak wavelength of greater than or equal to about 500 nm and less than or equal to about 550 nm, and a volume of the core of greater than or equal to about 15% and less than or equal to about 50%, based on a total volume of the quantum dot.

20 Claims, 10 Drawing Sheets

(51) Int. Cl.
*C09K 11/08* (2006.01)
*C09K 11/88* (2006.01)
*H01L 27/32* (2006.01)
*H10K 59/38* (2023.01)
*B82Y 20/00* (2011.01)
*B82Y 40/00* (2011.01)

(52) U.S. Cl.
CPC ............ *C09K 11/883* (2013.01); *H10K 59/38* (2023.02); *B82Y 20/00* (2013.01); *B82Y 40/00* (2013.01)

(56) References Cited

U.S. PATENT DOCUMENTS

| | | | |
|---|---|---|---|
| 11,060,019 B2 | 7/2021 | Kim et al. | |
| 11,236,270 B2 | 2/2022 | Park et al. | |
| 11,424,425 B2 | 8/2022 | Park et al. | |
| 2017/0052444 A1 | 2/2017 | Park et al. | |
| 2018/0112523 A1* | 4/2018 | Yang | E21B 47/107 |
| 2018/0231843 A1* | 8/2018 | Park | G02F 1/133617 |
| 2018/0374920 A1 | 12/2018 | Welch et al. | |
| 2019/0211262 A1* | 7/2019 | Park | C09K 11/883 |
| 2020/0243713 A1 | 7/2020 | Sunderland et al. | |
| 2020/0283680 A1 | 9/2020 | Jun et al. | |
| 2021/0098727 A1 | 4/2021 | Won et al. | |
| 2022/0145178 A1 | 5/2022 | Park et al. | |

FOREIGN PATENT DOCUMENTS

| | | |
|---|---|---|
| KR | 20170075874 A | 7/2017 |
| KR | 1865220 B1 | 6/2018 |
| KR | 20180090512 A | 8/2018 |
| KR | 20190041430 A | 4/2019 |
| KR | 20190114178 A | 10/2019 |
| KR | 1020200064882 A | 6/2020 |
| KR | 20210039177 A | 4/2021 |
| KR | 20210041373 A | 4/2021 |
| WO | WO-2019215060 A1 * | 11/2019 |

OTHER PUBLICATIONS

Office Action dated Nov. 8, 2023 of the corresponding Korean Patent Application No. 10-2021-0121899.

* cited by examiner

Pattern Preparation by using a photoresist

Repeating the Patterning Process three times

QUANTUM DOT, COMPOSITION INCLUDING QUANTUM DOT, QUANTUM DOT COMPOSITE, DISPLAY PANEL, AND ELECTRONIC DEVICE INCLUDING SAME

CROSS-REFERENCE TO RELATED APPLICATION

This application claims priority to and the benefit of Korean Patent Application No. 10-2021-0121899 filed in the Korean Intellectual Property Office on Sep. 13, 2021, and all the benefits accruing therefrom under 35 U.S.C. § 119, the entire content of which is incorporated herein by reference.

BACKGROUND

1. Field

A quantum dot, a quantum dot composite, a display panel, and an electronic device are disclosed.

2. Description of the Related Art

Quantum dots are nano-sized semiconductor nanocrystalline materials, the optical properties, for example, luminescent properties, of which may be controlled, for example, by changing a size thereof, a composition thereof, or a combination thereof. Luminescent properties of the quantum dots may be applied to, e.g., used in, various electronic devices, for example, display devices. When applied in devices, the quantum dots may be applied in the form of a composite. Accordingly, there exists a need for developing quantum dots and quantum dot composites that are environmentally friendly and capable of exhibiting improved physical properties when applied to, e.g., used in, electronic devices.

SUMMARY

An embodiment provides a quantum dot emitting green light having an increased light absorption.

An embodiment provides a quantum dot composition including the quantum dots and a dispersion.

An embodiment provides a quantum dot composite including the quantum dots.

An embodiment provides a display panel including the quantum dot composite.

An embodiment provides an electronic device (e.g., a display device) including the display panel.

The quantum dot according to an embodiment includes a core including a first semiconductor nanocrystal, and a shell disposed on the core, the shell including a second semiconductor nanocrystal, wherein the quantum dot includes a metal including indium and zinc, and a non-metal including phosphorus and sulfur, does not include cadmium, and has an optical density (OD) of about 0.4 to about 0.6 per 1 milligram (mg) of the quantum dot for a wavelength of 450 nanometers (nm) and an emission peak wavelength of greater than or equal to about 500 nm and less than or equal to about 550 nm, and a volume of the core based on a total volume of the quantum dot of greater than or equal to about 15% and less than or equal to about 50%.

The volume of the core may be greater than or equal to about 15% and less than or equal to about 35%, based on the total volume of the quantum dot.

A molar ratio of phosphorus to sulfur in the quantum dot may be about 1:1.0 to about 1:7.0.

The molar ratio of phosphorus to sulfur in the quantum dot may be about 1:2.0 to about 1:7.0.

A molar ratio of indium to zinc in the quantum dot may be about 1:3.0 to about 1:11.0.

The molar ratio of indium to zinc in the quantum dot may be about 1:5.0 to about 1:10.0.

The first semiconductor nanocrystal may include indium and phosphorus and the second semiconductor nanocrystal may include zinc and sulfur.

The first semiconductor nanocrystal may further include gallium.

The second semiconductor nanocrystal may further include selenium.

The first semiconductor nanocrystal may further include gallium and the second semiconductor nanocrystal may further include selenium.

A quantum dot composition according to an embodiment includes a plurality of the quantum dots, and a polymerizable monomer, a dispersant, a solvent, or a combination thereof.

The polymerizable monomer may include a polymerizable compound including a carbon-carbon double bond, a compound including a thiol group, or a combination thereof.

The dispersant may include a compound or polymer including a carboxyl group.

A quantum dot composite according to an embodiment includes a matrix and a plurality of the quantum dots dispersed in the matrix.

A display panel according to an embodiment includes a color conversion layer including a plurality of regions including a color conversion region, wherein the quantum dot composite is disposed in the color conversion region.

The display panel may further include a light emitting panel including a light emitting source, the color conversion region may include a first color conversion region configured to convert light emitted from the light emitting panel into light of a first emission spectrum and the first color conversion region may include the quantum dot composite.

The color conversion region may further include a second color conversion region configured to convert light emitted from the light emitting panel into light having a second emission spectrum different from the first emission spectrum.

The first emission spectrum may be a green emission spectrum having an emission peak wavelength of from about 500 nm to about 550 nm, and the second emission spectrum may be a red emission spectrum having an emission peak wavelength of from about 600 nm to about 650 nm.

An electronic device according to an embodiment includes the display panel.

In an embodiment, the electronic device is a display device.

In an embodiment, a quantum dot includes a core including a first semiconductor nanocrystal, the first semiconductor nanocrystal including indium, phosphorus, and gallium, and a shell disposed on the core, the shell including a second semiconductor nanocrystal, the second semiconductor nanocrystal including zinc, and sulfur, wherein a molar ratio of phosphorus to sulfur in the quantum dot is about 1:2.0 to about 1:7.0, wherein a molar ratio of indium to zinc in the quantum dot is about 1:5.0 to about 1:10.0, wherein a size of the core is about 2.3 nanometers to about 4.0 nanometers, wherein a thickness of the shell may be about 0.3 nanometers to about 2.0 nanometers, and wherein the quantum dot has an emission peak wavelength of greater than or equal to about 500 nanometers and less than or equal to about 550 nanometers.

In the quantum dots according to an embodiment, as the volume of the core absorbing light increases based on the total volume of the quantum dot, the absorption of light, for example, blue light, per unit weight of the quantum dot increases. The matrix in which the quantum dots are dispersed forms a composite form with the quantum dots to exhibit improved optical properties, for example, increased blue light absorption, and improved green light or red light conversion efficiency according to the increased blue light absorption. Accordingly, the quantum dot composite according to an embodiment may be advantageously applied to, e.g., used in, various display devices and, for example, biological labeling such as a biosensor or bioimaging, a photodetector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
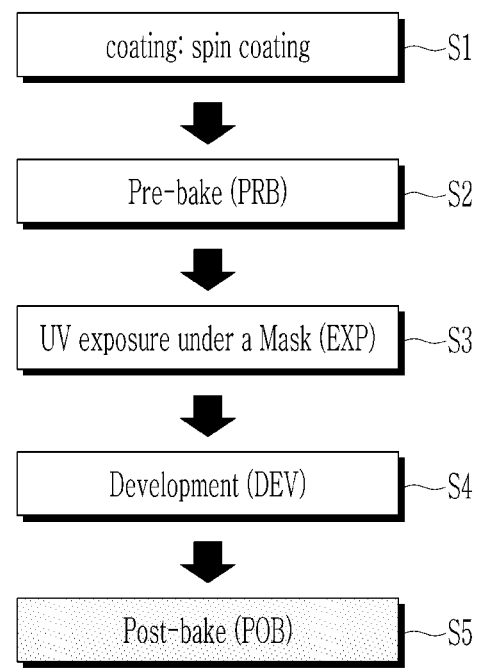
FIG. 1A is a schematic view showing a pattern forming process using a quantum dot composition for preparing a quantum dot composite according to an embodiment.
Figure 1A:
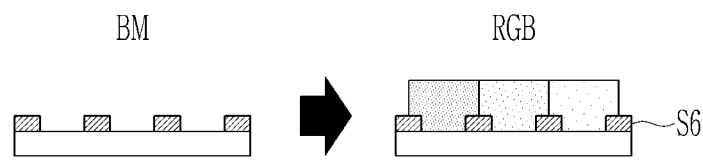

Advantages and characteristics of this disclosure and a method for achieving the same will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used, e.g., non-technical, dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to replacement of a hydrogen of a compound by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br or —I), a hydroxy group (—OH), a nitro group (—NO$_2$), a cyano group (—CN), an amino group (—NRR', wherein R and R' are each independently hydrogen or C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof. The total number of carbon atoms in a group is inclusive of any substituents, e.g., a cyanoethyl group is a C3 alkyl group.

As used herein, when a definition is not otherwise provided, "alkyl" refers to a linear or branched saturated monovalent hydrocarbon group (methyl, ethyl hexyl, etc.). Unless specified otherwise, an alkyl group has from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a carbon-carbon double bond. Unless specified otherwise, an alkenyl group has from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a carbon-carbon triple bond. Unless specified otherwise, an alkenyl group has from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an arene (e.g., a phenyl or naphthyl group). Unless specified otherwise, an aryl group has from 6 to 50 carbon atoms, or 6 to 18 carbon atoms, or 6 to 12 carbon atoms.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" group is a group represented by —NRR, (R is each independently hydrogen, a C1 to C12 alkyl group, a C7 to C20 alkylarylene group, a C7 to C20 arylalkylene group, or a C6 to C18 aryl group.

As used herein, when a definition is not otherwise provided, "hetero" refers to inclusion of one to three heteroatoms, e.g., N, O, S, Si, P, or a combination thereof.

As used herein, when a definition is not otherwise provided, "alkylene group" refers to a straight or branched saturated aliphatic hydrocarbon group having at least two valences and optionally substituted with a, e.g., at least one, substituent.

As used herein, when a definition is not otherwise provided, "arylene group" refers to a functional group having at least two valences obtained by removal of at least two hydrogens in an, e.g., at least one, aromatic ring, and optionally substituted with a, e.g., at least one, substituent.

As used herein, when a definition is not otherwise provided, "aliphatic group" or "aliphatic hydrocarbon" refers to a saturated or unsaturated linear or branched C1 to C30 group consisting of carbon and hydrogen, and "aromatic organic group" includes a C6 to C30 aryl group or a C2 to C30 heteroaryl group, and "alicyclic group" refers to a saturated or unsaturated C3 to C30 cyclic group consisting of carbon and hydrogen.

As used herein, when a definition is not otherwise provided, "(meth)acrylate" refers to including acrylate, methacrylate, or a combination thereof. The (meth)acrylate may include a (C1 to C10 alkyl)acrylate, a (C1 to C10 alkyl) methacrylate, or a combination thereof.

As used herein, the upper and lower endpoints set forth for various values may be independently combined to provide a range.

As used herein, when a definition is not otherwise provided, "light conversion" is an emission amount (G or R) of the quantum dot composite (single film) relative to the light amount (B-B') absorbed from the excitation light (e.g., blue light) (B) of the quantum dot composite. As used herein, the "light conversion efficiency" is an emission amount (G or R) of the quantum dot composite relative to the emission amount (B) of the excitation light. The total light amount (B) of excitation light is obtained by integrating a photoluminescent (PL) spectrum, the PL spectrum of the quantum dot composite film is measured, a light amount (G or R) in a green or red wavelength emitted from the quantum dot composite film and a light amount (B') of excitation light are obtained, and light conversion, light conversion efficiency, and blue light absorption are obtained by the following equations:

$$A/(B-B') \times 100 = \text{light conversion (\%)}$$

$$A/B \times 100 = \text{light conversion efficiency (\%)}$$

$$(B-B')/B \times 100 = \text{blue light absorption (\%) of single film}$$

As used herein, when a definition is not otherwise provided, "dispersion" refers to dispersion wherein a dispersed phase is a solid and a continuous phase includes a liquid. The "dispersion" may include a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, when a definition is not otherwise provided, "quantum dot" refers to a nanostructure that exhibits quantum confinement or exciton confinement, such as semiconductor-based nanocrystals (particles), for example, luminescent nanostructure (e.g., capable of emitting light by energy excitation). As used herein, "quantum dot" is not limited in a shape thereof, unless otherwise defined.

As used herein, a dimension (e.g., size, diameter, thickness, etc.) may be an average dimension (e.g., size, diameter, thickness, etc.). As used herein, the "average" may be mean or median. The dimension may be a value obtained by electron microscopic analysis. The dimension may be a value calculated taking into consideration the composition and optical properties (e.g., ultraviolet (UV) absorption wavelength) of the quantum dots.

As used herein, when a definition is not otherwise provided, "quantum efficiency (or quantum yield)" may be measured in a solution state or in a solid state (in a composite). In an embodiment, quantum efficiency (or quantum yield) is the ratio of photons emitted to photons absorbed by the nanostructure or population thereof. In an embodiment, quantum efficiency may be measured by any suitable method. For example, for fluorescence quantum yield or efficiency, there may be two methods: an absolute method and a relative method. In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to photoluminescence (PL) wavelengths thereof, but the present disclosure is not limited thereto.

The quantum efficiency (or quantum yield) may be reproducibly determined using suitable equipment, for example, commercially available equipment from Hitachi or Hamamatsu, etc. and referring to manuals provided by, for example, respective equipment manufacturers.

The full width at half maximum (FWHM) and photoluminescence (PL) peak wavelength may be measured, for example, by an emission spectrum obtained by a spectrophotometer such as a fluorescence spectrophotometer or the like As used herein, when a definition is not otherwise provided, the phrase not including cadmium (or other toxic heavy metals or given elements) means that a concentration of cadmium (or the corresponding heavy metals or given elements) is less than or equal to about 100 parts per millions by weight (ppm), less than or equal to about 50 ppm, less than or equal to about 10 ppm, or near zero. In an embodiment, substantially no cadmium (or its heavy metal) is present, or, if present, in an amount below the detection limit of a given detection means or at an impurity level.

As used herein, when a definition is not otherwise provided, "optical density" refers to an amount of light when light of a specific wavelength having a constant intensity passes through a solution layer and the luminous intensity becomes the constant intensity. The optical density is a result of the Beer-Lambert law, to be described herein, or a value divided by a thickness of the solution layer through which the wavelength has passed. As used herein, the absorbance at 450 nm of a quantum dot solution contained in a cuvette having a 1 centimeter (cm) optical path is defined as optical density.

Semiconductor nanocrystals, also called quantum dots, are crystalline semiconductor materials with nanoscale particle sizes. Quantum dots have a large surface area per unit volume, exhibit a quantum confinement effect, and may exhibit properties different from those of bulk materials having the same composition. Quantum dots absorb light from an excitation source to be in an excited state, and emit energy corresponding to bandgap energies thereof.

The quantum dots may be applied, e.g., used, as light emitting materials in display devices. For example, the quantum dot composite including a plurality of quantum dots dispersed in a polymer matrix or the like may be used as a light conversion layer (e.g., a color conversion layer) that converts a light (e.g., blue light) of a desired wavelength, for example, green light or red light from a light source (e.g., backlight unit (BLU), organic light emitting diode (OLED), micro light emitting diode (μLED), mini light emitting diode (miniLED), etc.) in a display device. That is, unlike a patterned film including the quantum dot composite may be used as an emission type color filter. Since the emission type color filter is disposed in front of the display device, for example, when excitation light, which has linearity while passing through the liquid crystal layer, reaches the emission type color filter, the excitation light is scattered in all directions to realize a wider viewing angle, and light loss due to the absorption type color filter may be avoided. A display device including a quantum dot-based emission type color filter, for example, a liquid crystal display, may further include a polarizer inside the panel, for example, under the color filter. The display device may further include a yellow-recycling film (YRF) configured to recycle light and an excitation light blocker (e.g., a blue-cut filter or a green light cut filter) according to an option.

The quantum dots having properties applicable to, e.g., useful in, electronic devices and the like may be cadmium-based quantum dots. However, cadmium may cause a serious environment/health problem and thus is a restricted element. Cadmium-free quantum dots may be for example a Group III-V-based nanocrystal. However, cadmium-free quantum dots may have problems with a low absorption for excitation light of individual quantum dots, and a quantum dot color filter may not sufficiently absorb blue light, and may exhibit relatively low light conversion efficiency and wide full width at half maximum of the emission spectrum.

The absorption of blue light in a quantum dot color filter may be based on the Beer-Lambert law, that is, $I=I_0 \exp(-\alpha)$, wherein I is an intensity of the absorbed blue light and $I_0$ is an intensity of the blue light of the light emitting source and $\alpha=\varepsilon l c$, wherein $\varepsilon$ is a molar absorption coefficient of the quantum dot, I is the light travel distance, and c is a molar concentration of the quantum dot. Since quantum dots may absorb blue light, the absorption coefficient ($\varepsilon$) of the quantum dots itself becomes the main variable for improving the absorption. The light travel distance (I) is a component determined by considering the thickness of the color filter and the optical path increased by the scattering body. Quantum dots may be added on a weight basis to implement color conversion pixels in a color filter, and how high a concentration (c) quantum dots are contained per unit weight may also be an important variable in determining the absorption. Therefore, increase of the light absorption coefficient of the quantum dot, addition of scatterers or making the pixel thickness thick before the back-scattering effect becomes large, and increase of the number of quantum dot particles per the same weight, that is, increase of the concentration as much as possible may be help improve the absorption of blue light.

InP-based quantum dots do not contain heavy metals such as cadmium (Cd) or lead (Pb), exhibit high quantum efficiency of over 90%, and may be mass-produced in industry. However, in the case of InP-based quantum dots, absorption of blue light occurs only in the core of InP and a part of the ZnSe shell. When emission is limited to green light, a size of the core is also fixed, and increasing the absorption coefficient of the quantum dot material itself may be difficult. In a method of increasing the density of the scatterer or the thickness of the color conversion pixel, when external light reflection or processability are considered, the scatterer may be added in an amount of about 3 weight percent (wt %)

to about 4 wt %, based on the total weight of the pixel, and the thickness may be adjusted to less than or equal to about 10 μm. Therefore, in order to increase the blue light absorption, increasing the number of quantum dots per weight to increase the concentration of quantum dots inside the color conversion pixel may be an accessible and realistic development direction.

The present inventors have developed a quantum dot including a metal including indium and zinc and a non-metal including phosphorus and sulfur but not including cadmium, having a core-shell structure of a core including a first semiconductor nanocrystal and a shell including a second semiconductor nanocrystal, and emitting green light. Minimizing a thickness of the shell may increase quantum efficiency but not contribute to absorbing excitation light or increase a size of the core itself to increase a volume of the core based on, e.g., relative to, a total volume of the quantum dot beyond a predetermined value, and the quantum dot has an optical density of about 0.4 cm$^2$/mg to about 0.6 cm$^2$/mg at a wavelength of about 450 nm, which may be significantly increased from that of a quantum dot including the same elements and emitting green light. In other words, the quantum dot according to an embodiment has a relatively increased volume of the core of the quantum dot, based on a total volume of the quantum dot, of greater than or equal to about 15% and less than or equal to about 50%, increasing an optical density per unit weight of the quantum dot, and increasing an absorption of excitation light.

In the quantum dot according to an embodiment, a method of increasing the volume of the core of the quantum dot relative to a total volume of the quantum dot may be to select a semiconductor nanocrystal including zinc and sulfur as a main component of the shell, which has a wide bandgap energy, and thus maintains a high energy barrier level even within a thin thickness range. The semiconductor nanocrystal including zinc and sulfur may be thinly disposed, e.g., disposed in a thin layer, on the core of the quantum dot, for example, a core including a semiconductor nanocrystal including indium and phosphorus to increase the volume of the core based on, e.g., relative to, the total volume of the quantum dot. Accordingly, the quantum dot according to an embodiment may include a core including the first semiconductor nanocrystal including indium and phosphorus and a shell including the second semiconductor nanocrystal including zinc and sulfur.

In an embodiment, the second semiconductor nanocrystal forming the shell does not include selenium. In an embodiment, the second semiconductor nanocrystal may form, e.g., may be in the form of, a single shell.

In an embodiment, the second semiconductor nanocrystal forming the shell includes selenium. In an embodiment, the second semiconductor nanocrystal may include a third semiconductor nanocrystal containing zinc and selenium and a fourth semiconductor nanocrystal containing zinc and sulfur, and the third semiconductor nanocrystal and the fourth semiconductor nanocrystal may form a single shell or a multilayer shell.

According to an embodiment, the core itself of the quantum dot may be increased by further including gallium in the first semiconductor nanocrystal forming the core in addition to indium and phosphorus, and the core may have a larger size to emit light at the same wavelength.

For example, when the first semiconductor nanocrystal including indium and phosphorus further includes gallium, as effective mass of electrons ($m_e$*) becomes larger, an energy difference between first ($E_1$) and second ($E_2$) absorption peaks on an absorption spectrum of the semiconductor nanocrystal according to Equation 1, so-called, "particle in a box", becomes smaller, increasing absorption of light at a wavelength of about 450 nm.

$$\Delta E = E2 - E1 = (3\pi^2\hbar^2)/(2m \cdot L^2) \quad \text{Equation 1}$$

In Equation 1,
m is an effective mass of electron,
L is quantum dot (QD) size (e.g., diameter),
π is a ratio of a circumference to a diameter,
ℏ is Reduce Plank's Constant, that is, a constant value (ℏ=h/2π) obtained by dividing the Plaque's constant h by twice the ratio of a circumference to a diameter (2π), and
$E_n$ is a quantized energy, where n means an energy level, that is, the quantum number, and thus $E_1$ is a quantum energy at the first energy level (n=1) of a semiconductor nanocrystal, $E_2$ is a quantum energy at the second energy level (n=2) of the semiconductor nanocrystal, and ΔE is a difference in energy levels, here $E_2$–$E_1$.

The semiconductor nanocrystal composed of indium, phosphorus, and gallium may have a larger core than a semiconductor nanocrystal composed of indium and phosphorus to emit light of the same wavelength, density of states contributing to absorbing excitation light may increase due to the core volume increase, and an extinction coefficient of each quantum dot may be increased. Resultantly, as the gallium is included at a higher concentration, the core to emit light of the same wavelength may have a larger size, and accordingly, a molar extinction coefficient of the quantum dot increases. Herein, even considering the reduced number of the quantum dots per unit weight due to a weight increase according to the core size increase, the light absorption may improve overall. Accordingly, a semiconductor nanocrystal including indium, phosphorus, and gallium instead of, e.g., as compared to, a semiconductor nanocrystal including indium and phosphorus may be used under a condition of the same shell thickness to achieve an effect of increasing a volume of a core actually contributing to absorbing light based on, e.g., relative to, a total volume of the quantum dots.

Accordingly, the first semiconductor nanocrystal forming the core of the quantum dots according to an embodiment may include indium and phosphorus, and optionally further include gallium. A molar ratio of gallium to indium in the semiconductor nanocrystal forming the core may be less than or equal to about 1. For example, the molar ratio of indium to gallium may be about 1:0.1 to about 1:1, about 1:0.1 to about 1:0.9, about 1:0.1 to about 1:0.8, about 1:0.1 to about 1:0.7, about 1:0.1 to about 1:0.6, about 1:0.1 to about 1:0.5, about 1:0.1 to about 1:0.4, about 1:0.1 to about 1:0.3, or about 1:0.1 to about 1:0.2. As described herein, as the concentration of gallium in the semiconductor nanocrystal including indium and phosphorus increases, the size of the core should increase in order to absorb or emit light of the same wavelength and thus a concentration of gallium to be used may be selected within an appropriate range taking into consideration the increase in the weight of quantum dot per unit weight.

In the quantum dot according to the embodiment in which the light absorption per unit weight is increased by the disclosed method, an optical density (OD) per 1 mg for, e.g., at, a wavelength of 450 nm is in the range of about 0.4 to about 0.6. In an embodiment, the optical density per 1 mg for, e.g., at, a wavelength of about 450 nm may be in the range of about 0.41 to about 0.59, for example, about 0.42 to about 0.59, about 0.43 to about 0.59, about 0.44 to about 0.59, about 0.45 to about 0.59, about 0.45 to about 0.58, or about 0.45 to about 0.57, but is not limited thereto.

An InP-based quantum dot may not exhibit an optical density per unit weight for, e.g., at, a wavelength of about 450 nm in the range of about 0.4 to about 0.6. The quantum dot according to an embodiment has a high optical density per unit weight for, e.g., at, a wavelength of about 450 nm as described herein, and the absorption of blue light, which is excitation light, is remarkably improved, and accordingly, when the quantum dot is applied to, e.g., used in, a color conversion member such as a color filter, better quantum efficiency, color purity, light conversion efficiency, or a combination thereof may be achieved.

The optical density per unit weight of a quantum dot may be measured using an optical density measuring instrument. For example, after preparing the quantum dot having a core including the semiconductor nanocrystal including indium and phosphorus and the shell including the semiconductor nanocrystal including zinc and sulfur in a method such as, for example, a wet process and the like, the quantum dots are dispersed in a solvent such as toluene and the like, the dispersion is put in a cuvette with an optical path having a specific length, for example, about 1 cm to measure optical density, and after removing the solvent, the quantum dots in the dispersion are measured with respect to a weight, which is used to convert the measured optical density based on a weight of about 1 mg of the quantum dots, obtaining optical density of the quantum dots per unit weight.

As described herein, the quantum dot according to an embodiment includes a semiconductor nanocrystal containing indium and phosphorus in a core, and a shell including semiconductor nanocrystal containing zinc and sulfur on the core, wherein a thickness of the shell is decreased, and thereby a molar ratio of sulfur (S) included in the shell of the quantum dot to phosphorus (P) included in the core of the quantum dot may also be reduced in a certain range. For example, in the quantum dot, a molar ratio of sulfur to phosphorus may be in a range of about 1:1.0 to about 1:7.0, for example, about 1:1.5 to about 1:7.0, about 1:2.0 to about 1:7.0, about 1:2.5 to about 1:7.0, about 1:3.0 to about 1:7.0, about 1:3.5 to about 1:7.0, about 1:4.0 to about 1:7.0, about 1:4.5 to about 1:7.0, about 1:5.0 to about 1:7.0, about 1:5.5 to about 1:7.0, about 1:6.0 to about 1:7.0, or about 1:6.5 to about 1:7.0, but is not limited thereto.

As described herein, the molar ratio of sulfur to phosphorus of the quantum dot according to an embodiment may be much smaller than about 10:1, and, for example, may be less than or equal to about 7.0:1. A quantum dot including an InP-based core and having a shell including a semiconductor nanocrystal including zinc and sulfur, or optionally, selenium, may have a molar ratio of sulfur to phosphorous of greater than or equal to about 10:1, but in the quantum dot according to an embodiment a molar ratio of sulfur to phosphorous may be less than or equal to about 7:1, wherein the shell has a very thin thickness relative to a size of the core.

A molar ratio of indium to zinc in the quantum dot according to an embodiment may be about 1:3.0 to about 1:11.0 or less. For example, the molar ratio of indium to zinc may be about 1:3.0 to about 1:10, about 1:4.0 to about 1:10, about 1:5.0 to about 1:10, about 1:5.0 to about 1:9.5, about 1:6.0 to about 1:9.5, or about 1:6.5 to about 1:9.5 or less, and may be appropriately adjusted within the disclosed ranges.

From the molar ratio of sulfur to phosphorus and the molar ratio of zinc to indium in the quantum dot, it can be seen that the thickness of the shell compared to the core of the quantum dot according to the embodiment is very thin.

For example, the size of the core of the quantum dot may be about 2.3 nm to about 4.0 nm, and the thickness of the shell of the quantum dot may be about 0.3 nm to about 2.0 nm. In an embodiment, the size of the core of the quantum dot may be about 2.4 nm to about 3.5 nm, for example, about 2.4 nm to about 3.3 nm, about 2.45 nm to about 3.2 nm, about 2.45 nm to about 3.0 nm, about 2.45 nm to about 2.95 nm, or about 2.47 nm to about 2.80 nm, and the thickness of the shell the quantum dot may be about 0.3 nm to about 1.5 nm, for example, about 0.4 nm to about 1.4 nm, about 0.5 nm to about 1.4 nm, about 0.6 nm to about 1.4 nm, about 0.7 nm to about 1.4 nm, about 0.8 nm to about 1.35 nm, about 0.8 nm to about 1.3 nm, about 0.8 nm to about 1.25 nm, about 0.8 nm to about 1.2 nm, about 0.8 nm to about 1.15 nm, about 0.8 nm to about 1.1 nm, or about 0.8 nm to about 1.0 nm, but are not limited thereto.

The core of the quantum dot according to an embodiment having the size as described herein has a volume of greater than or equal to about 15% and less than or equal to about 50%, based on the total volume of the quantum dot. For example, the core of the quantum dot may be greater than or equal to about 15% and less than or equal to about 48%, greater than or equal to about 15% and less than or equal to about 45%, greater than or equal to about 15% and less than or equal to about 40%, greater than or equal to about 15% and less than or equal to about 35%, greater than or equal to about 15% and less than or equal to about 30%, greater than or equal to about 15% and less than or equal to about 28%, greater than or equal to about 15% and less than or equal to about 27%, greater than or equal to about 15% and less than or equal to about 26%, greater than or equal to about 15% and less than or equal to about 25%, greater than or equal to about 15% and less than or equal to about 23%, greater than or equal to about 15% and less than or equal to about 23%, greater than or equal to about 15% and less than or equal to about 20%, greater than or equal to about 15% and less than or equal to about 19%, greater than or equal to about 15% and less than or equal to about 18%, or greater than or equal to about 15% and less than or equal to about 17%, based on the total volume of the quantum dot, but is not limited thereto.

As described herein, in the quantum dot according to an embodiment, the volume occupied by the core relative to the total volume of the quantum dot is very high compared to an InP-based quantum dot that emits green light. The quantum dot according to an embodiment has a higher blue light absorption per unit weight, and accordingly, when the quantum dot is used as a color conversion member such as a color filter, superior quantum efficiency and color purity based on a higher light absorption, light conversion efficiency, and the like may be achieved.

When the quantum dots according to an embodiment are dispersed in various types of matrices for, e.g., used in the, manufacturing a quantum dot color filter, etc., a greater number per unit weight, that is, a higher concentration of the quantum dots may be dispersed. Accordingly, the quantum dot composite may absorb more excitation light from a light emitting source, for example, a light emitting source that emits blue light. That is, a quantum dot composite having an increased blue light absorption may be provided. Such a quantum dot composite may be advantageously applied to, e.g., used in, a color conversion layer or the like in various display devices.

When the emission peak of the quantum dot according to an embodiment exists between about 500 nm and about 550 nm, that is, when the quantum dot emits green light, the emission peak of the quantum dot may be present in the range of greater than or equal to about 510 nm, greater than or equal to about 520 nm, greater than or equal to about 530 nm, or greater than or equal to about 535 nm, and less than or equal to about 545 nm, less than or equal to about 540 nm, or less than or equal to about 535 nm.

When the quantum dot according to an embodiment has a core size and a shell thickness in the aforementioned ranges, the size of the quantum dot may be about 2.36 nm to about 8 nm, for example, about 2.4 nm to about 7.7 nm, about 2.5 nm to about 7.5 nm, about 2.5 nm to about 7.0 nm, about 2.6 nm to about 6.5 nm, about 2.7 nm to about 6.3 nm, about 2.7 nm to about 6.0 nm, about 2.8 nm to about 6.0 nm, about 2.8 nm to about 5.8 nm, about 2.8 nm to about 5.5 nm, about 3.0 nm to about 5.5 nm, about 3.0 nm to about 5.0 nm, about 3.5 nm to about 5.0 nm, about 3.5 nm to about 4.8 nm, about 3.8 nm to about 4.8 nm, about 4.0 nm to about 4.8 nm, or about 4.1 nm to about 4.7 nm, but is not limited thereto.

The size or average size of the quantum dot may be calculated from an electron microscope analysis image. In an embodiment, the size (or average size) may be a diameter or equivalent diameter (or an average value thereof) determined from electron microscopic image analysis.

A shape of the quantum dot is not particularly limited, may for example be a spherical shape, polyhedron, pyramid, multipod, or cube shape, nanotube, nanowire, nanofiber, nanosheet, or a combination thereof, but is not limited thereto.

The quantum dot may include an organic ligand and/or a component of an organic solvent, which was used to prepare the quantum dot, on the surface thereof. The organic ligand and/or the component of the organic solvent may be bound to the quantum dot surface.

In an embodiment, the quantum dot may have a quantum efficiency of greater than or equal to about 85%, greater than or equal to about 87%, greater than or equal to about 88%, greater than or equal to about 90%, greater than or equal to about 91%, greater than or equal to about 92%, greater than or equal to about 93%, greater than or equal to about 94%, or greater than or equal to about 95% in a solution state or a solid state. The quantum dot may have a full width at half maximum (FWHM) of less than or equal to about 50 nm, for example, less than or equal to about 45 nm, less than or equal to about 40 nm, or less than or equal to about 38 nm in a solution state or a solid state.

The quantum dot according to an embodiment may be prepared by a method that includes preparing a core including a semiconductor nanocrystal further including indium and phosphorus, and optionally gallium, and reacting the precursors forming the semiconductor nanocrystal shell with the core to form a semiconductor nanocrystal shell further including zinc and sulfur, and optionally selenium, on the core, in a suitable solvent. When forming the semiconductor nanocrystal shell, the reaction may be performed by including an appropriate organic ligand, surfactant, or a combination thereof together if desired.

The preparing of the semiconductor nanocrystal core may include reacting indium and phosphorus compounds for preparing the semiconductor nanocrystal core, and optionally a gallium precursor to prepare a semiconductor nanocrystal core in-situ or a commercially available semiconductor nanocrystal core may be used. In an embodiment, the core may be formed by a hot injection method in which a phosphorus precursor in a state in which a solution including an indium precursor and optionally a metal precursor further including a gallium precursor, and optionally a ligand is heated to a high temperature, for example, 200° C. or higher. The preparing method of quantum dot according to an embodiment as described herein may be performed through various quantum dot preparing methods.

In each reaction step for producing the quantum dot, the contents between a phosphorus precursor, or a gallium precursor relative to indium, and among a zinc precursor and a sulfur precursor, and optionally a selenium precursor, and the total amount of each precursor may be adjusted to obtain size ranges, volume ranges, or a combination thereof of the core and the shell of the aforementioned quantum dot. In each step, the predetermined reaction time may be adjusted to obtain the desired composition, structure, or a combination hereof (e.g., a volume of the core relative to a volume of the shell, etc.) in the final quantum dot.

The indium precursor may include indium halide, indium nitrate, indium hydroxide, indium fluoride, indium chloride, indium bromide, indium, iodide, indium oxide, indium sulfate, indium carboxylate, indium acetate, indium acetylacetonate, or a combination thereof, but is not limited thereto.

The phosphorus precursor may include tris(trimethylsilyl) phosphine, tris(dimethylamino)phosphine, triethylphosphine, tributylphosphine, trioctylphosphine, triphenylphosphine, tricyclohexylphosphine, or a combination thereof, but is not limited thereto.

The gallium precursor may include triethyl gallium, gallium acetylacetonate, gallium chloride, gallium iodide, and the like, but is not limited thereto.

The zinc precursor may be a Zn metal powder, an alkylated Zn compound, a Zn alkoxide, a C2 to C10 Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof, but is not limited thereto. For example, the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, and zinc oxide, zinc peroxide, zinc perchlorate, zinc sulfate, and the like, but is not limited thereto.

The sulfur-containing precursor may be, for example, a sulfur powder, hexane thiol, octane thiol, decane thiol, dodecane thiol, hexadecane thiol, mercaptopropyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof, but is not limited thereto.

The selenium-containing precursor is not particularly limited, and for example, the selenium-containing precursor may be selenium, selenium-trioctylphosphine (Se-TOP), selenium-tributylphosphine (Se-TBP), selenium-triphenylphosphine pin (Se-TPP), tellurium-tributylphosphine (Te-TBP), or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$ (wherein, R and R' are each independently (e.g., a C1 to C40 or a C3 to C35 or a C8 to C24) a substituted or unsubstituted aliphatic hydrocarbon (e.g., an alkyl group, an alkenyl group, or an alkynyl group), or (e.g., a C6 to C40 or a C6 to C24) a substituted or unsubstituted aromatic hydrocarbon (e.g., an aryl group), or a combination thereof.

The organic ligand coordinates the surface of the prepared nanocrystals, and enables the nanocrystals to be well dispersed in the solution phase. Specific examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; a phosphine oxide such as substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, a substituted or unsubstituted octylphosphine oxide (e.g., trioctylphosphine oxide (TOPO)), and the like; diphenyl phosphine, a triphenyl phosphine compound, or an oxide compound thereof; phosphonic acid, and the like, but are not limited thereto. The organic ligand may be used alone or as a mixture of two or more.

The (organic) solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkanes, alkenes, alkynes, etc.) such as hexadecane, octadecane, octadecene, and squalane; a C6 to C30 aromatic hydrocarbon such as phenyldodecane, phenyltetradecane, and phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, benzyl ether, or a combination thereof. Types and contents of the solvent may be appropriately selected taking into consideration the types of the precursors and the organic ligand.

When a nonsolvent is added to the prepared final reaction solution, the nanocrystals coordinated with the organic ligand may be separated (e.g., precipitation). The nonsolvent may be a polar solvent that is miscible with the solvent used in the reaction but cannot disperse the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed by centrifugation, precipitation, chromatography, or distillation. Separated nanocrystals may be washed by adding to a washing solvent as desired. Separated nanocrystals may be washed by adding to a washing solvent as desired. The washing solvent has no particular limit and may have a similar solubility parameter to that of the ligand and may, for example, include hexane, heptane, octane, chloroform, toluene, benzene, and the like.

A composition for preparing a quantum dot composite according to an embodiment includes the aforementioned quantum dots, and a polymerizable monomer, a dispersant, or a combination thereof.

The polymerizable monomer may be a (photo) polymerizable monomer having a carbon-carbon double bond. The dispersant may disperse the quantum dots. The dispersant may include a carboxyl group (—COOH)-containing compound (monomer or polymer). The composition may optionally further include an (thermal or photo) initiator; a (organic) solvent, a liquid vehicle, or a combination thereof; or a combination thereof. The composition may be a photosensitive composition.

Since the contents of the quantum dots in the composition are the same as those of the quantum dots according to the embodiment described herein, a detailed description thereof is omitted.

A content of the quantum dot in the composition may be appropriately adjusted taking into consideration the end use (e.g., such as a color conversion layer of an emission type color filter or a color conversion panel). In the composition (or composite), the content of the quantum dot(s) may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on the total weight or total solids of the composition or composite. The content of the quantum dots may be less than or equal to about 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, or less than or equal to about 30 wt %, based on the total weight or total solids of the composition or composite. Herein, (e.g., when the composition includes an organic solvent), the content based on the total solids in the composition may correspond to the content of the corresponding component in the quantum dot composite. For example, when the quantum dot composition is a solvent-free system (not including an organic solvent), the content range in the composition may correspond to the content range in the composite.

The dispersant may contribute to securing dispersibility of quantum dots or metal oxide particulates to be described herein. In an embodiment, the dispersant may be, for example, a carboxyl group-containing organic compound including a, such as a monomer or a polymer, and may include, for example, a binder polymer. The dispersant or binder polymer may be an insulating polymer.

The carboxyl group-containing organic compound may include a combination of monomers including a first monomer having a carboxyl group and a carbon-carbon double bond, a second monomer having a carbon-carbon double bond and a hydrophobic moiety and not having a carboxyl group, and optionally a third monomer having a carbon-carbon double bond and a hydrophilic moiety and not having a carboxyl group, or a copolymer thereof; a multiple aromatic ring-containing polymer (hereinafter, a cardo binder) having a backbone in which two aromatic rings in a main chain are bonded to quaternary carbon atoms that are constituent atoms of other cyclic moieties, and having a carboxyl group; or a combination thereof.

The dispersant may include the first monomer, the second monomer, and optionally, the third monomer.

A content of the dispersant (or binder polymer) in the composition may be greater than or equal to about 0.5 wt %, for example, greater than or equal to about 1 wt %, greater than or equal to about 5 wt %, greater than or equal to about 10 wt %, greater than or equal to about 15 wt %, greater than or equal to about 20 wt %, greater than or equal to about 30 wt %, greater than or equal to about 40 wt %, or greater than or equal to about 50 wt %, based on the total weight or total solid content of the composition or composite, but is not limited thereto. The content of the dispersant (or binder polymer) may be less than or equal to about 60 wt %, less than or equal to about 50 wt %, less than or equal to about 40 wt %, less than or equal to about 35 wt %, less than or equal to about 33 wt %, less than or equal to about 30 wt %, less than or equal to about 20 wt %, or less than or equal to about 10 wt %, based on the total weight or total solids of the composition or composite. The content of the dispersant (or binder polymer) may be about 0.5 wt % to about 55 wt %, based on the total weight or total solids of the composition or composite.

The polymerizable (e.g., photopolymerizable) monomer having the carbon-carbon double bond may include a (e.g., photopolymerizable) (meth)acryl-based monomer. The monomer may be a precursor for the insulating polymer.

The content of the monomer may be greater than or equal to about 0.5 wt %, for example, greater than or equal to about 1 wt %, greater than or equal to about 2 wt %, greater than or equal to about 5 wt %, greater than or equal to about 10 wt %, greater than or equal to about 15 wt %, greater than or equal to about 20 wt %, greater than or equal to about 25 wt %, or greater than or equal to about 30 wt %, based on the total weight or total solids of the composition or composite. The content of the photopolymerizable monomer may be less than or equal to about 60 wt %, less than or equal to about 50 wt %, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on the total weight or total solids of the composition or composite.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, a content of the initiator may be appropriately adjusted considering types and contents of the polymerizable monomers. In an embodiment, the content of the initiator may be greater than or equal to about 0.01 wt %, for example, greater than or equal to about 1 wt %, greater than or equal to about 5 wt %, or greater than or equal to about 10 wt %, and for example, less than or equal to about 9 wt %, less than or equal to about 8 wt %, less than or equal to about 7 wt %, less than or equal to about 6 wt %, or less than or equal to about 5 wt %, based on the total weight of the composition (or the total weight of the solid content), but is not limited thereto.

The composition may further include a (multi- or mono-functional) thiol compound having a, e.g., at least one, thiol group at the terminal end thereof, a metal oxide particulate, or a combination thereof.

The metal oxide particulate may include $TiO_2$, $SiO_2$, $BaTiO_3$, $Ba_2TiO_4$, ZnO, or a combination thereof. In an embodiment, the metal oxide particulate may be $TiO_2$.

In the composition, a content of the metal oxide particulate may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, or greater than or equal to about 35 wt %; less than or equal to about 60 wt %, less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on the total weight (or the solid weight) of the composition; or a combination thereof. The metal oxide particulates may be non-luminescent. Herein, the term metal oxide may include an oxide of a metal or a semi-metal.

A diameter of the metal oxide particulates is not particularly limited, and may be appropriately selected. The diameter of the metal oxide particulates may be greater than or equal to about 100 nm, for example, greater than or equal to about 150 nm, or greater than or equal to about 200 nm, and less than or equal to about 1000 nm, less than or equal to about 800 nm, less than or equal to about 500 nm, less than or equal to about 400 nm, or less than or equal to about 300 nm.

The thiol compound included in the composition may be represented by Chemical Formula 1:

Chemical Formula 1

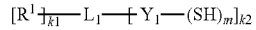

In Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are each independently hydrogen or a C1 to C30 linear or branched alkyl group and are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ORR', or —C(=O)ONRR' (wherein R and R' are each independently hydrogen or a C1 to C20 linear or branched alkyl group), $L_1$ is a carbon atom, a substituted or unsubstituted C1 to C30 alkylene group, a substituted or unsubstituted C1 to C30 alkylene group wherein a, e.g., at least one, methylene (—$CH_2$—) is replaced by sulfonyl (—$SO_2$—), carbonyl (CO), ether (—O—), sulfide (—S—), sulfoxide (—SO—), ester (—C(=O)O—), amide (—C(=O)NR—) (wherein R is hydrogen or a C1 to C10 alkyl group), or combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein a, e.g., at least one, methylene (—CH$_2$—) is replaced by sulfonyl (—S(═O)$_2$—), carbonyl (—C(═O)—), ether (—O—), sulfide (—S—), sulfoxide (—S(═O)—), ester (—C(═O)O—), amide (—C(═O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or greater, k1 is 0 or an integer of 1 or greater, k2 is an integer of 1 or greater, and a sum of m and k2 is an integer of 3 or greater, provided that m does not exceed the valence of $Y_1$, and a sum of k1 and k2 does not exceed the valence of $L_1$.

The (multi) thiol compound may be a dithiol compound, a trithiol compound, a tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis(3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the (multi) thiol compound may be less than or equal to about 60 wt %, less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on the total weight of the composition (or the total weight of solids). The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on the total weight of the composition (or the total weight of solids).

The composition may further include an organic solvent (or liquid vehicle, hereinafter referred to as a solvent). The type of useable solvent is not particularly limited. Non-limiting examples of the solvent or liquid vehicle may be ethyl 3-ethoxy propionate; an ethylene glycol such as ethylene glycol, diethylene glycol, polyethylene glycol, and the like; a glycol ether such as ethylene glycol monomethyl ether, ethylene glycol monoethyl ether, diethylene glycol monomethyl ether, ethylene glycol diethyl ether, diethylene glycol dimethyl ether, and the like; a glycol ether acetate such as ethylene glycol acetate, ethylene glycol monoethyl ether acetate, diethylene glycol monoethyl ether acetate, diethylene glycol monobutyl ether acetate, and the like; a propylene glycol such as propylene glycol, and the like; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, dipropylene glycol diethyl ether, and the like; a propylene glycol ether acetate such as propylene glycol monomethyl ether acetate, dipropylene glycol monoethyl ether acetate, and the like; an amide such as N-methylpyrrolidone, dimethyl formamide, dimethyl acetamide, and the like; a ketone such as dimethylsulfoxide; methylethylketone (MEK), methyl isobutyl ketone (MIBK), cyclohexanone, and the like; a petroleum such as solvent naphtha, and the like; an ester such as ethyl acetate, butyl acetate, ethyl lactate, and the like; an ether such as tetrahydrofuran, diethyl ether, dipropyl ether, dibutyl ether, and the like, chloroform, a C1 to C40 aliphatic hydrocarbon (e.g., alkane, alkene, or alkyne), a halogen- (e.g., chlorine-)substituted C1 to C40 aliphatic hydrocarbon (e.g., dichloroethane, trichloromethane, and the like), a C6 to C40 aromatic hydrocarbon (e.g., toluene, xylene, and the like), a halogen- (e.g., chlorine-) substituted C6 to C40 aromatic hydrocarbon, or a combination thereof, but are not limited thereto.

The types and contents of the organic solvent may be appropriately determined by considering the aforementioned main components (i.e., the quantum dots, the dispersant, the polymerizable monomer, the initiator, and if used, the thiol compound) and types and contents of additives which is described herein. The composition may include a solvent in a residual amount except for a desired content of the (non-volatile) solid. A combination including more than one type of organic solvent may be used, The composition (e.g., inkjet composition) may have a viscosity at 25° C. of greater than or equal to about 4 centipoise (cPs), greater than or equal to about 5 cPs, greater than or equal to about 5.5 cPs, greater than or equal to about 6.0 cPs, or greater than or equal to about 7.0 cPs. The composition may have a viscosity at 25° C. of less than or equal to about 12 cPs, less than or equal to about 10 cPs, or less than or equal to about 9 cPs.

When used for inkjet, the composition may be discharged to a substrate at room temperature, and may be heated, for example, to form a quantum dot-polymer composite film or a pattern thereof. The ink composition, while having the aforementioned viscosity, may have a surface tension at about 23° C. of greater than or equal to about 21 millinewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m, and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. The ink composition may have a surface tension of less than or equal to about 31 mN/m, less than or equal to about 30 mN/m, less than or equal to about 29 mN/m, or less than or equal to about 28 mN/m.

In an embodiment, the composition may further include, for example, an additive included in the composition for photoresist or the ink composition. The additive may include a light diffusing agent, a leveling agent, a coupling agent, and the like. For specific details, for example, reference may be made to the contents described in US-2017-0052444-A1.

The composition may be prepared by a method that includes preparing a quantum dot dispersion including the aforementioned quantum dots, the aforementioned dispersant, a solvent, or a combination thereof; and mixing an initiator; a polymerizable monomer (e.g., an acrylic monomer); and optionally a thiol compound, metal oxide particulates, and optionally the aforementioned additive in the quantum dot dispersion. Each of the aforementioned components may be mixed sequentially or simultaneously, and the order is not particularly limited.

The composition may be used to provide the quantum dot composite according to an embodiment, for example, a quantum dot-polymer composite. The composition may provide, for example, a quantum dot-polymer composite by radical polymerization. The composition for preparing a quantum dot composite according to an embodiment may be a quantum dot-containing photoresist composition applicable to, e.g., useful in, photolithography. The composition according to an embodiment may be an ink composition capable of providing a pattern by a printing method (e.g., a droplet discharging method such as inkjet printing).

Accordingly, the quantum dot composite according to an embodiment may include a polymer matrix and the aforementioned quantum dots dispersed in the matrix, and may be configured to emit green light.

Based on the total weight of the quantum dot composite, the content of the plurality of quantum dots may be greater than or equal to about 10%, greater than or equal to about 20%, greater than or equal to about 30%, greater than or equal to about 40%, greater than or equal to about 50%, or greater than or equal to about 60%, for example, greater than or equal to about 10% and less than or equal to about 60%, greater than or equal to about 15% and less than or equal to about 60%, greater than or equal to about 20% and less than or equal to about 60%, greater than or equal to about 25% and less than or equal to about 60%, greater than or equal to about 30% and less than or equal to about 60%, greater than or equal to about 30% and less than or equal to about 55%, greater than or equal to about 35% and less than or equal to about 55%, greater than or equal to about 40% and less than or equal to about 55%, greater than or equal to about 45% and less than or equal to about 60%, greater than or equal to about 45% and less than or equal to about 55%, or about 50%, but is not limited thereto.

Based on the total weight of the quantum dot composite, the content of the matrix may be greater than or equal to about 10%, greater than or equal to about 20%, greater than or equal to about 30%, greater than or equal to about 40%, greater than or equal to about 50%, greater than or equal to about 60%, or greater than or equal to about 70%, and less than or equal to about 90%, less than or equal to about 80%, less than or equal to about 70%, less than or equal to about 60%, less than or equal to about 50%, less than or equal to about 40%, for example, greater than or equal to about 10% and less than or equal to about 90%, greater than or equal to about 20% and less than or equal to about 85%, greater than or equal to about 25% and less than or equal to about 80%, greater than or equal to about 30% and less than or equal to about 75%, greater than or equal to about 30% and less than or equal to about 70%, greater than or equal to about 30% and less than or equal to about 65%, greater than or equal to about 30% and less than or equal to about 60%, greater than or equal to about 30% and less than or equal to about 55%, greater than or equal to about 35% and less than or equal to about 55%, greater than or equal to about 35% and less than or equal to about 50%, greater than or equal to about 30% and less than or equal to about 45%, greater than or equal to about 30% and less than or equal to about 40%, or greater than or equal to about 35% and less than or equal to about 45%, but is not limited thereto.

The (polymer) matrix may include a crosslinked polymer, a linear polymer, or a combination thereof. The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof. The linear polymer may include a carboxylic acid-containing repeating unit.

The matrix may include the aforementioned dispersant (e.g., a carboxyl group-containing monomer or polymer), a polymerization product of a polymerizable monomer including a, e.g., at least one, carbon-carbon double bond, for example 2 or more, 3 or more, 4 or more, or 5 or more, such as an insulating polymer, and optionally a polymerization product between the polymerizable monomer and thiol compounds having a, e.g., at least one, for example, two or more, thiol groups at the terminal end.

In an embodiment, the polymer matrix may include a crosslinked polymer, a linear polymer, or a combination thereof. The cross-linked polymer may include a thiolene resin, crosslinked poly(meth)acrylate, or a combination thereof. In an embodiment, the crosslinked polymer may be a polymerization product of the aforementioned polymerizable monomer, and optionally a (multi) thiol compound. Descriptions for the quantum dots, dispersant, polymerizable monomer, and (multi) thiol compound are the same as described herein.

The quantum dot composite may be in the form of a film, for example, in the form of a patterned film. The patterning may be performed using a photolithographic method or the like, since the composition for preparing the quantum dot composite includes a photocurable material as the dispersant or a photopolymerizable monomer. In an embodiment, the quantum dot composite may be printed in a patterned form through an inkjet printing process or the like, to be described in more detail here.

The display panel according to an embodiment may include the quantum dot composite. The display panel may include a color conversion layer including a plurality of regions including a color conversion region, and the quantum dot composite according to the aforementioned embodiment may be disposed in the color conversion region in the color conversion layer. In an embodiment, the color conversion layer may further include a partition wall defining the plurality of regions.

In an embodiment, the display panel may further include a light emitting panel including a light emitting source, and the color conversion layer may convert an emission spectrum of light emitted from the light emitting panel. For example, the color conversion layer may absorb blue light emitted from the light emitting source and convert the blue light into green light.

In an embodiment, the color conversion layer may be in a form of a patterned film.

In an embodiment, the color conversion region of the color conversion layer may include a, e.g., at least one, first region (hereinafter also referred to as a first partition) configured to convert the light irradiated by the excitation light into light of a first emission spectrum and emit it, and the first region may include the quantum dot composite according to an embodiment. The color conversion layer may be in the form of a quantum dot composite patterned film.

The color conversion region may include a (e.g., one or more) second region (hereinafter also referred to as a second partition) configured to emit a second light different from the first light (e.g., by irradiation of excitation light), and the second region may include a quantum dot composite including quantum dots having an emission peak wavelength different from that of the quantum dots according to an embodiment.

An emission spectrum of the first light may be a green light emission spectrum having an emission peak wavelength of about 500 nm to about 550 nm (e.g., about 510 nm to about 540 nm), and an emission spectrum of the second light may be a red light emission spectrum having an emission peak wavelength of about 610 nm to about 660 nm (e.g., about 620 nm to about 650 nm).

The color conversion layer may further include a (e.g., at least one) third region (hereinafter also referred to as a third partition) that emits or passes a third light (e.g., blue light) different from the first light and the second light. The third light may include excitation light. The third light may include blue light having an emission peak wavelength in a range of about 430 nm to about 470 nm.

The color conversion layer (or the patterned film of the quantum dot composite) may be prepared using a photoresist composition, which may include forming a film of a composition for preparing a quantum dot composite according to an embodiment on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a quantum dot composite (S4).

Referring to FIG. 1A, the aforementioned composition is applied to a predetermined thickness on a substrate using an appropriate method such as spin coating or slit coating to form a film. The formed film may be optionally subjected to a pre-baking (PRB). The pre-baking may be performed by selecting an appropriate condition from conditions of a temperature, time, an atmosphere, and the like.

The formed (or optionally prebaked) film is exposed to light having a predetermined wavelength under a photoresist mask having a predetermined pattern (EXP). A wavelength and intensity of the light may be selected considering types and contents of the photoinitiator, types and contents of the quantum dots, and the like.

The exposed film is treated with an alkali developing solution (e.g., dipping or spraying) to dissolve an unexposed region and obtain a desired pattern (DEV). The obtained pattern may be, optionally, post-baked (POB) to improve crack resistance and solvent resistance of the pattern (S5), for example, at a temperature of about 150° C. to about 230° C. for a predetermined time (e.g., greater than or equal to about 10 minutes or greater than or equal to about 20 minutes).

When the color conversion layer or the patterned film of the quantum dot composite has a plurality of repeating partitions (that is, color conversion regions), each repeating partition may be formed by preparing a plurality of compositions including quantum dots (e.g., red light-emitting quantum dots, green quantum dots, or optionally, blue quantum dots) having desired luminescent properties (emission peak wavelength and the like) and repeating the aforementioned pattern-forming process as many times as desired (e.g., 2 times or more, or 3 times or more) for each composition, resultantly obtaining a quantum dot-polymer composite having a desired pattern (S6). For example, the quantum dot-polymer composite may have a pattern of at least two repeating color partitions (e.g., RGB color partitions). The quantum dot-polymer composite pattern may be used as a photoluminescence type color filter in a display device.

Figure 1B:
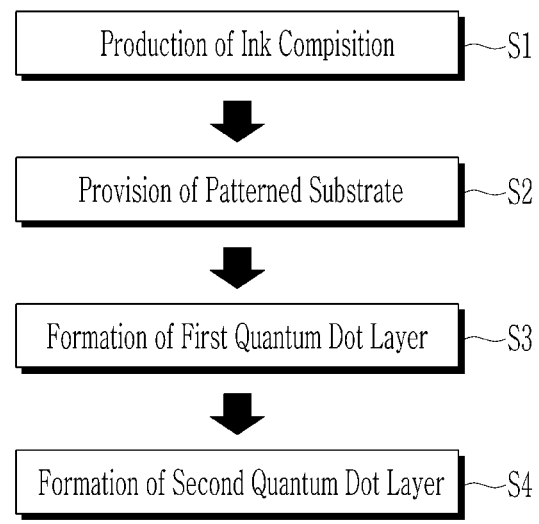
FIG. 1B schematically shows a pattern forming process using an ink composition as a form of a quantum dot composite according to an embodiment.

The color conversion layer or the patterned film of the quantum dot composite may be produced using an ink composition configured to form a pattern in an inkjet manner. Referring to FIG. 1B, such a method may include preparing an ink composition according to an embodiment (S1), providing a substrate (e.g., with pixel areas patterned by electrodes and optionally banks, etc.) (S2), depositing an ink composition on the substrate (or the pixel region) to form, for example, a first quantum dot layer (or first region) (S3); and depositing an ink composition on the substrate (or the pixel region) to form, for example, a second quantum dot layer (or second region) (S4). The forming of the first quantum dot layer and the second quantum dot layer may be simultaneously or sequentially carried out.

The depositing of the ink composition may be performed using an appropriate liquid crystal discharger, for example an inkjet or nozzle printing system having an ink storage and a, e.g., at least one, print head. The deposited ink composition may provide a first or second quantum dot layer through the solvent removal and polymerization by the heating. The method may provide a highly precise quantum dot-polymer composite film or patterned film for a short time by the simple method.

The aforementioned quantum dot or quantum dot composite (pattern) may be included in an electronic device. Such electronic devices may include a display device, a light emitting diode (LED), an organic light emitting diode (OLED), a quantum dot LED, a sensor, a solar cell, an imaging sensor, a photodetector, or a liquid crystal display device, but not limited to thereto. The aforementioned quantum dot may be included in an electronic apparatus. The electronic apparatus may include, but is not limited to, a portable terminal device, a monitor, a notebook computer, a television, an electric sign board, a camera, a VR (virtual reality) or AR (augmented reality) device, a car, and the like. The electronic apparatus may be a portable terminal device including a display device (or a light emitting device) including quantum dots, a monitor, a notebook computer, an electronic display board, a television, a VR (virtual reality) or AR (augmented reality) device. The electronic apparatus may be a camera or a mobile terminal device including an image sensor including quantum dots. The electronic apparatus may be a camera or a vehicle including a photodetector including quantum dots.

Hereinafter, the display panel and the color conversion panel will be described in more detail with reference to the drawings.

Figure 2:
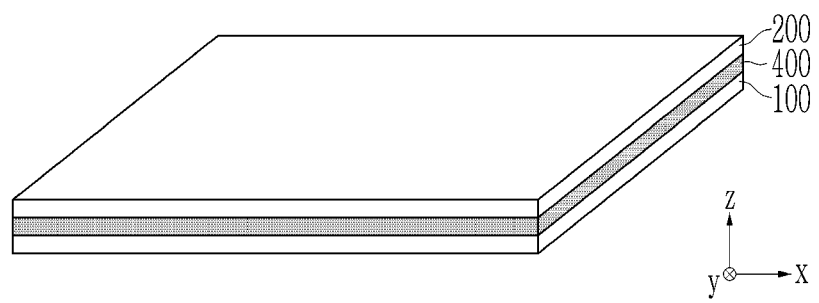
FIG. 2 is a perspective view illustrating an example of a display panel according to an embodiment.
Figure 3:
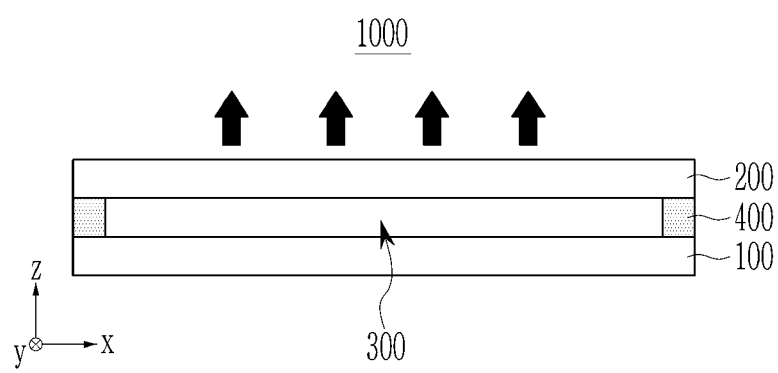
FIG. 3 is a cross-sectional view of the display panel of FIG. 2.

Referring to FIGS. 2 and 3, the display panel 1000 according to an embodiment includes a light emitting panel 100, a color conversion panel 200, and a light transmitting layer 300 between the light emitting panel 100 and the color conversion panel 200, and a binder 400 for bonding the light emitting panel 100 and the color conversion panel 200.

The light emitting panel 100 and the color conversion panel 200 may face each other with the light transmitting layer 300 therebetween, and the color conversion panel 200 may be disposed in a direction in which light is emitted from the light emitting panel 100. The binder 400 may be disposed along the edges of the light emitting panel 100 and the color conversion panel 200, and may be, for example, a sealing material.

In FIGS. 2 and 3, although the light transmitting layer 300 is present between the light emitting panel 100 and the color conversion panel 200, and the binder 400 is disposed along the edges of the light emitting panel 100 and the color conversion panel 200, the light transmitting layer 300 and the binder 400 may be omitted and may not be included.

That is, the light emitting panel 100 and the color conversion panel 200 may be directly coupled without interposing the light transmitting layer 300.

Figure 4:
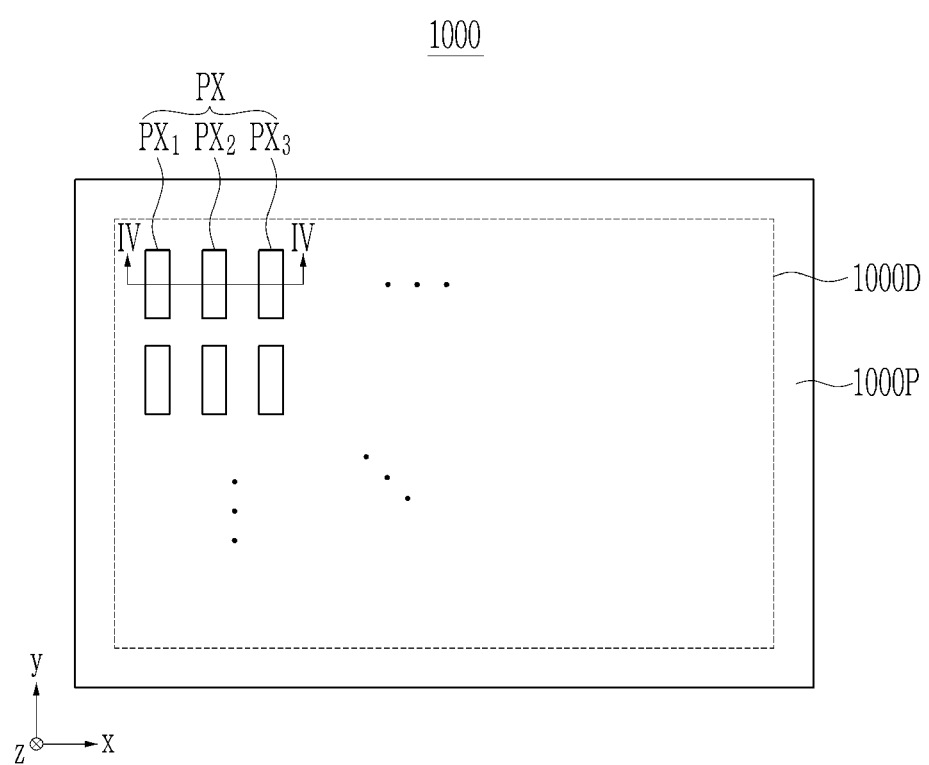
FIG. 4 is a plan view illustrating an example of a pixel arrangement of the display panel of FIG. 2.

Referring to FIG. 4, a display panel 1000 according to an embodiment includes a display area 1000D for displaying an image and a non-display area 1000P disposed around the display area 1000D and in which the binder 400 is disposed.

The display area 1000D may include a plurality of pixels PX arranged along a row (e.g., x direction), a column (e.g., y direction), or a combination thereof, and each pixel PX may include a plurality of subpixels $PX_1$, $PX_2$, and $PX_3$ displaying different colors. Herein, as an example, a configuration in which three subpixels $PX_1$, $PX_2$, and $PX_3$ constitute one pixel is illustrated, but the configuration is not limited thereto. An additional subpixel such as a white subpixel may be further included, and one or more subpixel displaying the same color may be included. The plurality of pixels PX may be arranged in, for example, a Bayer matrix, a PenTile matrix, a diamond matrix, or a combination thereof, but is not limited thereto.

Each of the subpixels $PX_1$, $PX_2$, and $PX_3$ may display a color of three primary colors or a combination of three primary colors, for example, red, green, blue, or a combination thereof. For example, the first subpixel $PX_1$ may display red, the second subpixel $PX_2$ may display green, and the third subpixel $PX_3$ may display blue.

In the drawing, an example in which all subpixels have the same size is illustrated, but the present disclosure is not limited thereto. A subpixel, e.g., at least one of the subpixels, may be larger or smaller than the other subpixels. In the drawing, an example in which all subpixels have the same shape is illustrated, but the present disclosure is not limited thereto. A subpixel, e.g., at least one of the subpixels, may have a different shape from other subpixels.

Figure 5:
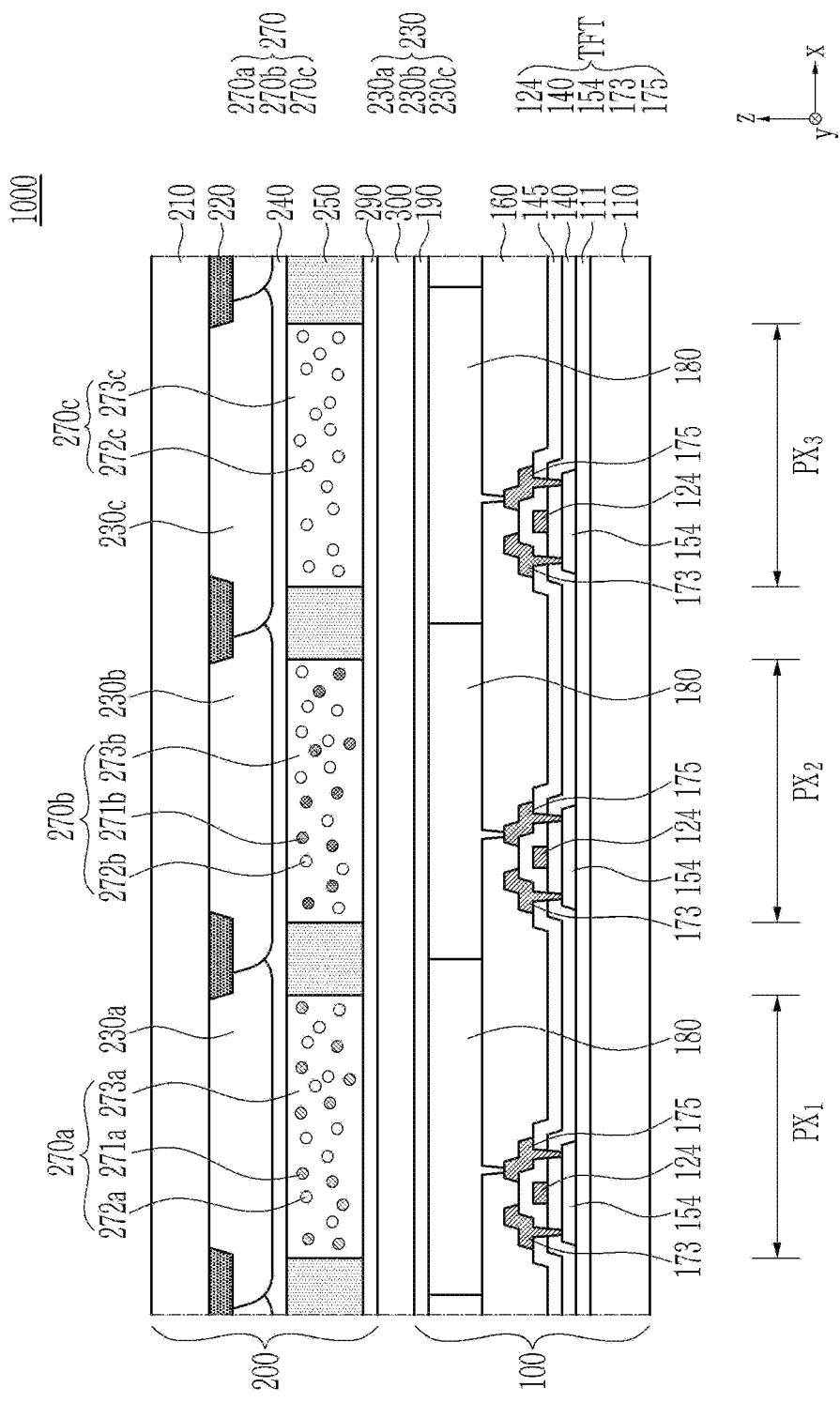
FIG. 5 is a cross-sectional view of the display panel of FIG. 4 taken along line IV-IV.

Referring to FIG. 5, the light emitting panel 100 and the color conversion panel 200 is sequentially described.

The light emitting panel 100 may include a light emitting element that emits light in a predetermined wavelength region and a circuit element for switching the light emitting element, driving the light emitting element, or a combination thereof. For example, the light emitting panel 100 may include a lower substrate 110, a buffer layer 111, a thin film transistor (TFT), a light emitting element 180, and an encapsulation layer 190.

The lower substrate 110 may be a glass substrate or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers, and may cover the whole surface of the lower substrate 110. The buffer layer 111 may be omitted.

The thin film transistor TFT may be a three-terminal element for switching the light emitting element 180, driving the light emitting element 180, which will be described herein, or a combination thereof and one or two or more may be included for each subpixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically connected to the semiconductor layer 154. In the drawings, a coplanar top gate structure is shown as an example, but the structure is not limited thereto and may have various structures.

The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including indium (In), zinc (Zn), tin (Sn), gallium (Ga), or a combination thereof, and the oxide semiconductor may include, for example, indium-gallium-zinc oxide, zinc-tin oxide, or a combination thereof, but are not limited thereto. The semiconductor layer 154 may include a channel region and doped regions disposed on both sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In the drawing, an example in which the gate insulating layer 140 is formed on the entire surface of the lower substrate 110 is illustrated, but the present disclosure is not limited thereto and may be selectively formed between the gate electrode 124 and the semiconductor 154. The gate insulating layer 140 may be formed of one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting element 180 to be described herein.

An interlayer insulating layer 145 is additionally formed between the gate electrode 124 and the source/drain electrodes 173 and 175. The interlayer insulating layer 145 may include an organic material, an inorganic material, or an organic-inorganic material, for example, an oxide, a nitride, or an oxynitride, for example, silicon oxide, silicon nitride, silicon oxynitride, or a combination thereof, but is not limited thereto. The interlayer insulating layer 145 may be formed of one or two or more layers.

A protective layer 160 is formed on the thin film transistor (TFT). The protective layer 160 may be, for example, a passivation layer. The protective layer 160 may include an organic material, an inorganic material, or an organic-inorganic material, for example, polyacrylic, polyimide, polyamide, polyamideimide, or a combination thereof, but is not limited thereto. The protective layer 160 may be formed of one or two or more layers.

The light emitting element 180 may be disposed for each subpixel $PX_1$, $PX_2$, and $PX_3$, and the light emitting element 180 disposed in each subpixel $PX_1$, $PX_2$, and $PX_3$ may be independently driven. The light emitting element 180 may be, for example, a light emitting diode, and may include a pair of electrodes and a light emitting layer between the pair of electrodes. The light emitting layer may include a light emitting body capable of emitting light in a predetermined wavelength region, and for example, may include a light emitting body that emits light in a first emission spectrum belonging to a visible wavelength spectrum. The light emitting body may include an organic light emitting body, an inorganic light emitting body, an organic-inorganic light emitting body, or a combination thereof, and may be one type or two or more types.

The light emitting element 180 may be, for example, an organic light emitting diode, an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

Figure 6:
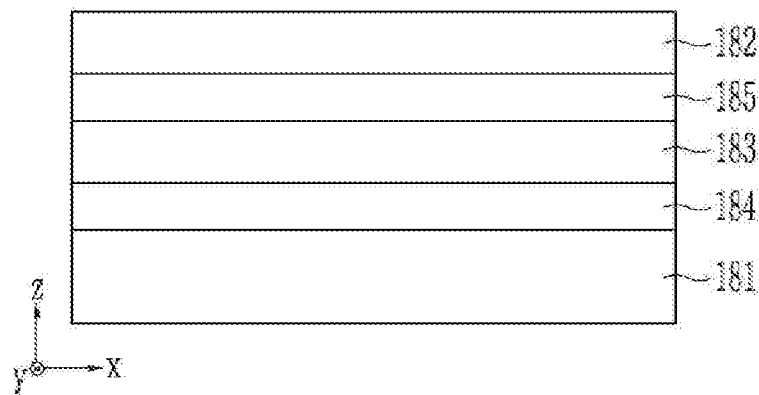
FIGS. 6 to 8 are cross-sectional views each showing examples of light emitting elements.
Figure 7:
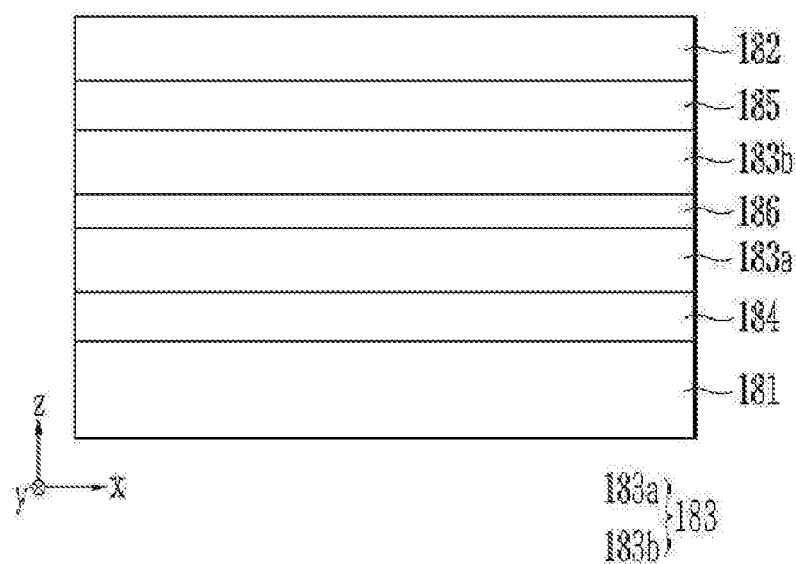
Figure 8:
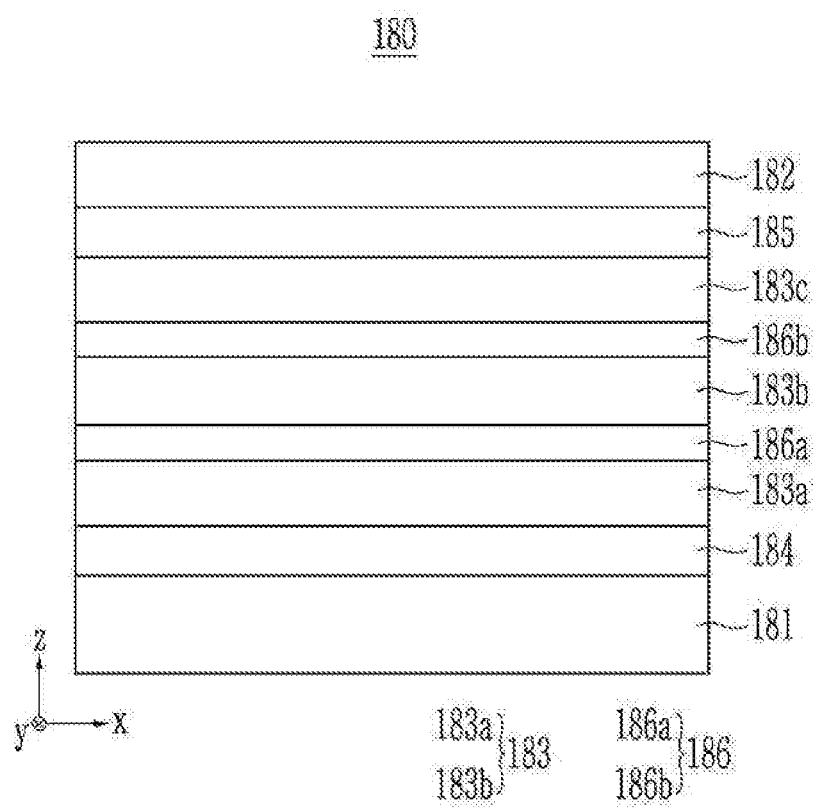

FIGS. 6 to 8 are cross-sectional views showing examples of light emitting elements, respectively.

Referring to FIG. 6, the light emitting element 180 includes a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may be disposed to face each other along a thickness direction (for example, z direction), and any one of the first electrode 181 and the second electrode 182 may be an anode and the other may be a cathode. The first electrode 181 may be a light transmitting electrode, a transflective electrode, or a reflecting electrode, and the second electrode 182 may be a light transmitting electrode or a transflective electrode. The light transmitting electrode or transflective electrode may be, for example, made of a thin single layer or multiple layers of metal thin film including conductive oxides such as indium tin oxide (ITO), indium zinc oxide (IZO), zinc oxide (ZnO), tin oxide (SnO), aluminum tin oxide (AlTO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflecting electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a light emitting body capable of emitting light of a specific wavelength. The specific wavelength may belong to a relatively short wavelength region of the visible light wavelength spectrum, and may be, for example, a blue emission wavelength (and a green emission wavelength if selected). A maximum emission wavelength of blue light emission may belong to a wavelength region of greater than or equal to about 400 nm and less than 500 nm, and may belong to a wavelength region of about 410 nm to about 490 nm or about 420 nm to about 480 nm within the disclosed range. The light emitting body may be one or two or more.

For example, the light emitting layer 183 may include a host material and a dopant material.

For example, the light emitting layer 183 may include a phosphorescent material, a fluorescent material, or a combination thereof.

For example, the light emitting body may include an organic light emitting body, and the organic light emitting body may be a low molecular weight compound, a polymer, or a combination thereof. When the light emitting body includes an organic light emitting body, the light emitting element 180 may be an organic light emitting diode.

For example, the light emitting body may include an inorganic light emitting body, and the inorganic light emitting body may be an inorganic semiconductor, quantum dot, perovskite, or a combination thereof. When the light emitting body includes an inorganic light emitting body, the light emitting element 180 may be a quantum dot light emitting diode, a perovskite light emitting diode, a micro light emitting diode, a nano light emitting diode, or the like, but is not limited thereto.

The auxiliary layers 184 and 185 may be disposed between the first electrode 181 and the light emitting layer 183 and between the second electrode 182 and the light emitting layer 183, respectively, and may be a charge auxiliary layer to control injection, mobility, or a combination hereof of charges, respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. An auxiliary layer, e.g., at least one of the auxiliary layers 184 and 185, may be omitted.

The light emitting elements 180 disposed in each of the subpixels $PX_1$, $PX_2$, and $PX_3$ may be the same or different from each other. The light emitting elements 180 disposed in each of the subpixels $PX_1$, $PX_2$, and $PX_3$ may emit light of the same emission spectrum, for example, each may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm. The light emitting elements 180 disposed in each of the subpixels $PX_1$, $PX_2$, and $PX_3$ may or may not be separated by a pixel defining layer (not shown).

Referring to FIG. 7, the light emitting element 180 may be a light emitting element having a tandem structure, and includes a first electrode 181 and a second electrode 182 facing each other; a first light emitting layer 183*a* and a second light emitting layer 183*b* between the first electrode 181 and the second electrode 182; a charge generation layer 186 between the first light emitting layer 183*a* and the second light emitting layer 183*b*, and optionally auxiliary layers 184 and 185 between the first electrode 181 and the first light emitting layer 183*a* and between the second electrode 182 and the second light emitting layer 183*b*.

The first electrode 181, the second electrode 182, and the auxiliary layers 184 and 185 are as described herein.

The first light emitting layer 183*a* and the second light emitting layer 183*b* may emit light having the same or different emission spectrum, and, for example, each may emit light having a blue emission spectrum. Detailed descriptions are the same as the light emitting layer 183 described herein.

The charge generation layer 186 may inject electric charges into the first light emitting layer 183*a*, the second light emitting layer 183*b*, or a combination thereof, and may control a charge balance between the first light emitting layer 183*a* and the second light emitting layer 183*b*. The charge generation layer 186 may include, for example, an n-type layer and a p-type layer, and may include, for example, an electron transport material; a hole transport material including an n-type dopant, a p-type dopant, or a combination thereof; or a combination thereof. The charge generation layer 186 may be one layer or two or more layers.

Referring to FIG. 8, the light emitting element 180 may be a light emitting element having a tandem structure, and includes a first electrode 181 and a second electrode 182 facing each other; a first light emitting layer 183*a*, a second light emitting layer 183*b*, and a third light emitting layer 183*c* between the first electrode 181 and the second electrode 182; a first charge generation layer 186*a* between the first light emitting layer 183*a* and the second light emitting layer 183*b*; a second charge generation layer 186*b* between the second light emitting layer 183*b* and the third light emitting layer 183*c*; and optionally, auxiliary layers 184 and 185 between the first electrode 181 and the first light emitting layer 183*a* and between the second electrode 182 and the third light emitting layer 183*c*.

The first electrode 181, the second electrode 182, and the auxiliary layers 184 and 185 are as described herein.

The first light emitting layer 183*a*, the second light emitting layer 183*b*, and the third light emitting layer 183*c* may emit light having the same or different emission spectrum, and, for example, each may emit light having a blue emission spectrum. Detailed descriptions are the same as the light emitting layer 183 described herein.

The first charge generation layer 186*a* may inject electric charges into the first light emitting layer 183*a*, the second light emitting layer 183*b*, or a combination thereof, and may control charge balances between the first light emitting layer 183*a* and the second light emitting layer 183*b*. The second charge generation layer 186*a* may inject electric charges into the second light emitting layer 183*b*, the third light emitting layer 183*c*, or a combination thereof, and may control charge balances between the second light emitting layer 183*b* and the third light emitting layer 183*c*. Each of the first and second charge generation layers 186*a* and 186*b* may be one layer or two or more layers.

Referring to FIGS. 2 to 5, the encapsulation layer 190 covers the light emitting element 180 and may include a glass plate, a metal thin film, an organic film, an inorganic film, an organic-inorganic film, or a combination thereof. The organic film may include, for example, an acrylic resin, a (ethacrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, an oxynitride, or a combination thereof, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 190 may be one or two or more layers.

The color conversion panel 200 converts the light of the specific spectrum supplied from the light emitting panel 100 into light of a first or second emission spectrum different from the specific spectrum supplied from the light emitting panel 100 and emits the light of the first or second emission spectrum to an observer (not shown). For example, the color conversion panel 200 may include an upper substrate 210, a light blocking pattern 220, a color filter layer 230, a planarization layer 240, a partition wall 250, a color conversion layer 270, and an encapsulation layer 290.

The upper substrate 210 may be a glass substrate or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto.

The color conversion layer 270 faces the light emitting element 180 of the light emitting panel 100. The color conversion layer 270 may include a, e.g., at least one, color conversion region for converting an emission spectrum of light supplied from the light emitting panel 100 into other emission spectrum, and the color conversion region may, for example, convert light in the emission spectrum supplied from the light emitting panel 100 into light in the emission spectrum of the color displayed by each of the subpixels $PX_1$, $PX_2$, and $PX_3$.

The color conversion region may include a color converting body that converts the emission spectrum of light supplied from the light emitting panel 100 into other emission spectrum, and the display panel according to the embodiment may include the quantum dot composite according to the embodiment in the color conversion region.

The color conversion region may convert the emission spectrum of light supplied from the light emitting panel into light having a wavelength spectrum of a color displayed by each of the subpixels $PX_1$, $PX_2$, and $PX_3$ and then may emit it, and accordingly, the quantum dot composite included in each color conversion region may be different from each other.

Referring to FIG. 5, at least a portion of the color conversion layer 270 may include the quantum dot composite including quantum dots. For example, the color conversion layer 270 may include a first color conversion region 270*a* included in the first subpixel $PX_1$ and including first quantum dots 271*a* (and optionally, secondary quantum dots 272*a* of the first color conversion region 270*a*), for example, in a first matrix 273*a*; a second color conversion region 270*b* included in the second subpixel $PX_2$ and including second quantum dots 271*b* (and optionally, secondary quantum dots 272*b* of the second color conversion region 270*b*), for example, in a second matrix 273*b*; and a light transmitting region 270*c*, for example, optionally including third quantum dots 272*c* in a third matrix 273*c*.

The first quantum dots 271*a* included in the first color conversion region 270*a* may convert light emitted from the light emitting panel 100 into light of the first emission spectrum that is the same as the wavelength spectrum of the color displayed by the first subpixel $PX_1$. The first emission spectrum may be different from the emission spectrum of the light emitted from the light emitting panel 100 and may have a longer wavelength than the emission spectrum.

The second quantum dots 271*b* included in the second color conversion region 270*b* may convert the light emitted from the light emitting panel 100 into light having the same second emission spectrum as the wavelength spectrum of the color displayed by the second subpixel $PX_2$. The second emission spectrum may be different from the first emission spectrum and may have a longer wavelength than the first emission spectrum.

For example, when the light emitting element 180 of the light emitting panel 100 emits light of a blue emission spectrum, and the first subpixel $PX_1$, the second subpixel $PX_2$, and the third subpixel $PX_3$ respectively displays red, green, and blue, the first quantum dots 271a included in the first color conversion region 270a may convert the light of the blue emission spectrum into light of the red emission spectrum, and the second quantum dots 271b included in the second color conversion region 270b may convert the light of the blue emission spectrum into light of the green emission spectrum. The first quantum dots 271a may emit light having a longer wavelength than that of the second quantum dots 271b, and the size of the first quantum dots 271a may be greater than the size of the second quantum dots 271b. The blue displayed in the third subpixel $PX_3$ may be displayed by the light of the blue emission spectrum emitted from the light emitting element 180 of the light emitting panel 100 and thus displayed through the light transmitting region 270c without a separate color conversion body (quantum dots) in the third subpixel $PX_3$. However, the third subpixel $PX_3$ may further include the color conversion body such as quantum dots configured to emit light of the blue emission spectrum.

The partition wall 250 may define each region of the color conversion layer 270 and be disposed between adjacent regions. For example, the partition wall 250 may respectively define the aforementioned first and second color conversion regions 270a and 270b and light transmitting region 270c and be disposed between the adjacent first and second color conversion regions 270a and 270b, between the second color conversion region 270b and the light transmitting region 270c which are neighboring each other, between the first color conversion region 270a and the light transmitting region 270c, which are neighboring each other, or a combination thereof. The partition wall 250 may provide a space to which a composition for the color conversion layer 270 is supplied and simultaneously, prevent each composition for the first color conversion region 270a, the second color conversion region 270b, and the light transmitting region 270c from overflowing into each neighboring first color conversion region 270a, second color conversion region 270b, and light transmitting region 270c during the process of forming the first color conversion region 270a, the second color conversion region 270b, and the light transmitting region 270c.

The partition wall 250 may directly contact the first color conversion region 270a, the second color conversion region 270b, and the light transmitting region 270c without separate layers between the partition wall 250 and the first color conversion region 270a, between the partition wall 250 and the second color conversion region 270b, and between the partition wall 250 and the light transmitting region 270c.

The color filter layer 230 may more precisely filter light emitted from the color conversion layer 270 and thus enhance color purity of the light emitted toward the upper substrate 210. For example, the first color filter 230a overlapped with the first color conversion region 270a may block light not converted by but transmitting the first quantum dots 271a of the first color conversion region 270a and for example, enhance color purity of light of the red emission spectrum. For example, the second color filter 230b overlapped with the second color conversion region 270b may block light not converted by but transmitting the second quantum dots 271b of the second color conversion region 270b and for example, enhance color purity of light of the green emission spectrum. For example, the third color filter 230c overlapped with the second color conversion region 270c may block light other than light of the blue emission spectrum and for example, enhance color purity of the blue emission spectrum. For example, at least some of the first, second, and third color filter 230a, 230b, and 230c may be omitted, for example, the third color filter 230c overlapped with the light transmitting region 270c may be omitted.

The light blocking pattern 220 may partition each subpixel $PX_1$, $PX_2$, and $PX_3$ and be disposed between the neighboring subpixels $PX_1$, $PX_2$, and $PX_3$. The light blocking pattern 220 may be, for example, a black matrix. The light blocking pattern 220 may be overlapped with the edges of the neighboring color filters 230a, 230b, and 230c.

The planarization layer 240 may be disposed between the color filter layer 230 and the color conversion layer 270, and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, or an oxynitride, for example, silicon oxide, silicon nitride, silicon oxynitride, or a combination thereof, but is not limited thereto. The planarization layer 240 may be one layer or two or more layers, and may cover the entire surface of the upper substrate 210.

The encapsulation layer 290 may cover the color conversion layer 270 and the partition wall 250, and may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, an oxynitride, or a combination thereof, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one or two or more layers.

The light transmitting layer 300 may be disposed between the light emitting panel 100 and the color conversion panel 200. The light transmitting layer 300 may be, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

Figure 9:
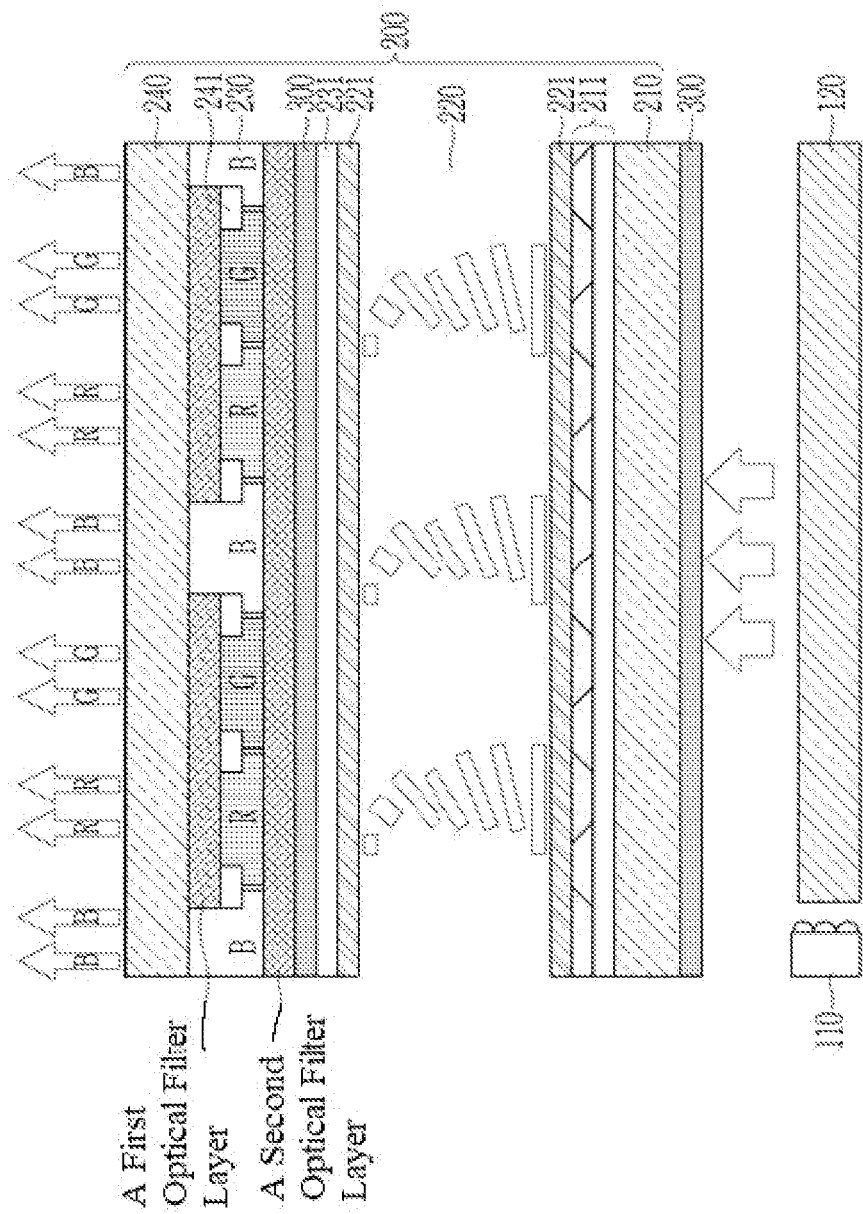
FIG. 9 is a schematic cross-sectional view of a display panel according to an embodiment.
Figure 10:
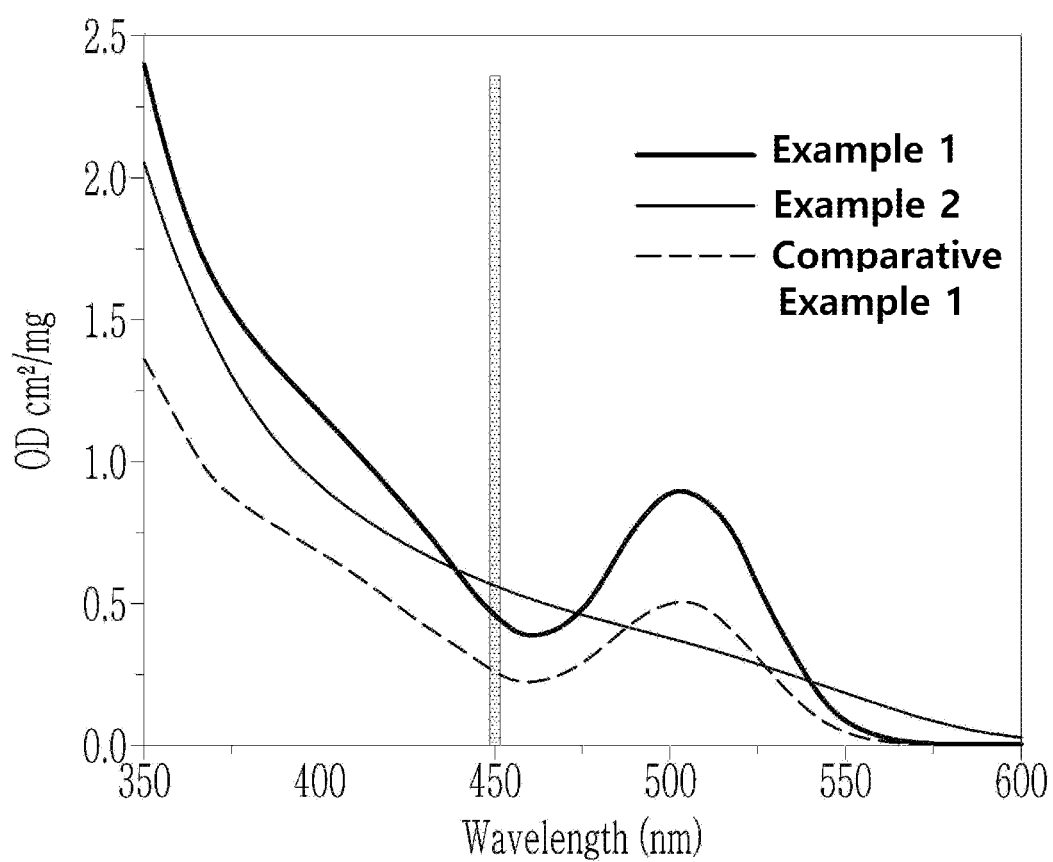
FIG. 10 is a graph of optical density (OD) (square centimeters per milligram ($cm^2/mg$)) versus wavelength (nm) showing the optical density (OD) per unit weight (1 mg) in the wavelength region of 350 nm to 600 nm of the quantum dots prepared in Examples 1 and 2 and Comparative Example 1.

Referring to FIG. 9, as a display device according to a non-limiting embodiment, for example, a liquid crystal display device is described with reference to the drawings. FIG. 9 is a schematic cross-sectional view of a liquid crystal display device according to a non-limiting embodiment.

Referring to FIG. 14, the display device of an embodiment includes a liquid crystal panel 200, a polarizing plate 300 disposed under the liquid crystal panel 200, and a backlight unit disposed under the polarizing plate 300. The backlight unit includes a light source 110 and a light guide plate 120. The backlight unit may be in the form of direct sunlight without a light guide plate.

The liquid crystal panel 200 may include a lower substrate 210, an upper substrate 240, and a liquid crystal layer 220 between the lower substrate 210 and the upper substrate 240, and may include a color conversion layer 230 disposed on the upper or lower surface of the upper substrate 240. The color conversion layer 230 may include the quantum dot polymer composite according to an exemplary embodiment.

The lower substrate 210 that is also referred to as an array substrate may be a transparent insulating material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizing plate 300 is provided under the lower substrate. Materials and structures of the polarizing plate 300 are not particularly limited. A backlight unit (e.g., emitting blue light) may be disposed under the polarizing plate 300. An upper optical element or an upper polarizing plate 300 may be provided between the liquid crystal layer 220 and the transparent substrate 240, but is not limited thereto. For example, the upper polarizing plate may be disposed between the liquid crystal layer 220 and the color conversion layer 230. The polarizing plate may be any suitable polarizer that used in a liquid crystal display device. The polarizing plate may be TAC (triacetyl cellulose) having a thickness of less than or equal to about 200 µm, but is not limited thereto. In an embodiment, the upper optical element may be a coating that controls a refractive index without a polarization function.

The light source 110 included in the backlight unit may emit blue light or white light. The light source may include, but is not limited to, a blue LED, a white LED, a blue OLED, a white OLED, or a combination thereof.

In an embodiment, the backlight unit may be an edge-type lighting. For example, the backlight unit may include a reflector (not shown), a light guide panel (not shown) provided on the reflector and providing a planar light source with the liquid crystal panel 200, an, e.g., at least one, optical sheet (not shown) on the light guide panel, for example, a diffusion plate, a prism sheet, and the like, or a combination thereof, but is not limited thereto. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally an, e.g., at least one, optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and the black matrix 241 has openings and hides a gate line, a data line, and a thin film transistor of the wire plate on the lower substrate. For example, the black matrix 241 may have a lattice shape. The color conversion layer 230 is provided in the openings of the black matrix 241 and has a quantum dot-polymer composite pattern including a first region R configured to emit first light (e.g., red light), a second region G configured to emit second light (e.g., green light), and a third region B configured to emit/ transmit, for example blue light. If desired, the color conversion layer 230 may further include a, e.g., at least one, fourth region. The fourth region may include quantum dots emitting light of a different color (e.g., cyan, magenta, and yellow) from the light emitted from the first to third regions.

The regions forming the pattern in the color conversion layer 230 may be repeated corresponding to the pixel area formed in the lower substrate. A transparent common electrode 231 may be provided on the photoluminescent color conversion layer 230.

The third region B configured to transmit/emit blue light may be a transparent color filter that does not change the emission spectrum of the light source. The blue light emitted from the backlight unit may be incident in a polarized state through the polarizing plate and the liquid crystal layer and may be emitted as is. If desired, the third region may include quantum dots emitting blue light.

If desired, the display device or the light emitting device according to an embodiment may further include an excitation light blocking layer or a first optical filter layer (hereinafter, referred to as a first optical filter layer). The first optical filter layer may be disposed between the lower surfaces of the first region R and the second region G and the substrate (e.g., the upper substrate 240) or on the upper surface of the substrate. The first optical filter layer may be a sheet having an opening in a portion corresponding to a pixel region (third region) displaying blue, and thus may be formed in portions corresponding to the first and second regions. Two or more first optical filter layers may be spaced apart from each other at positions overlapped with the first and second regions, and optionally, the third region. When the light source includes a green light emitting element, a green light blocking layer may be disposed on the third region.

The first optical filter layer may block light having, for example, a predetermined wavelength region in the visible light region and may transmit light in the other wavelength regions, and for example, may block blue light (or green light) and may transmit light except the blue light (or green light). The first optical filter layer may transmit, for example, green light, red light, and/or yellow light which is a mixed color thereof. The first optical filter layer may transmit blue light and block green light, and may be disposed on the blue light emitting pixel.

The display device may further include a second optical filter layer (e.g., red/green light or yellow light recycling layer) that is disposed between the light emitting layer and the liquid crystal layer (e.g., between the light emitting layer and the upper polarizer), transmits at least a portion of the third light (excitation light), and reflects at least a portion of the first light, at least a portion of the second light, or at least a portion of the first light and at least a portion of the second light. The first light may be red light, the second light may be green light, and the third light may be blue light. The second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer 140 and reflected. The reflected green light and red light may pass through the first and second sections and to be emitted to the outside of the display device 10.

The second optical filter layer or the first optical filter layer may be formed as an integrated layer having a relatively planar surface.

The first optical filter layer may include a polymer thin film including a dye, a pigment, or a combination thereof absorbing light in a wavelength which is to be blocked. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The first optical filter layer or the second optical filter layer may be formed by laminating two layers having different refractive indexes refractive index. For example, the first/second optical filter layer may be formed by alternately laminating a material having a high refractive index and a material having a low refractive index.

Hereinafter, the embodiments are illustrated in more detail with reference to examples. However, they are exemplary examples of the present disclosure, and the present disclosure is not limited thereto.

EXAMPLES

Analysis Methods
1. Ultraviolet-Visible (UV-Vis) Spectroscopy

Ultraviolet (UV) spectroscopy is performed using an Agilent Cary5000 spectrometer to obtain the UV-Visible absorption spectrum.

2. Inductively Coupled Plasma (ICP) Analysis

Inductively coupled plasma atomic emission spectroscopy (ICP-AES) is performed using a Shimadzu ICPS-8100.

3. Transmission Electron Microscopy (TEM) Analysis

TEM analysis is performed using a UT F30 Tecnai electron microscope.

4. Measurement of Optical Density

An amount of 10 microliters (μL) of crude quantum dots are diluted in 990 μL of toluene and put in a 1 milliliter (mL) cuvette with a 1 centimeter (cm) optical path and then, measured with respect to optical density at each wavelength in a region of 300 nanometers (nm) to 700 nm by using UV-Vis absorption spectroscopy (Shimadzu UV-2600).

Example 1: Preparation and Analysis of InP/ZnS Quantum Dots (1) Preparation of InP Core In a reaction flask, indium acetate and palmitic acid are dissolved in 1-octadecene and then, heated at 120° C. under vacuum. The indium and the palmitic acid are used in a molar ratio of about 1:3. After 1 hour, an atmosphere in the reactor is converted into nitrogen. After heating the flask at 280° C., a mixed solution of tris(trimethylsilyl)phosphine (TMS3P) and trioctylphosphine is quickly injected thereinto and then, reacted for 10 minutes. The reaction solution is rapidly cooled to room temperature, acetone is added thereto and then, centrifuged to obtain precipitates, and the precipitates are dispersed again in toluene. A content of TMS3P is set to be 0.5 mole per 1 mole of indium.

(2) Preparation of InP/ZnS Quantum Dots

An S/trioctylphosphine (TOP) stock solution is prepared by dispersing sulfur in trioctylphosphine. In a reaction flask, zinc acetate, zinc fluoride, and oleic acid are dissolved in 1-octadecene and then, vacuum-treated at 120° C. for 10 minutes. After internally substituting the reaction flask with nitrogen ($N_2$), the solution is set at 200° C. The prepared toluene dispersion of the InP semiconductor nanocrystal core, the S/TOP stock solution, and oleylamine are injected into the solution and then, reacted for 5 minutes, while maintained at 200° C., obtaining a reaction solution containing particles (quantum dots) having an InP core and a ZnS shell disposed thereon.

(3) Analysis of Characteristics of Quantum Dots

A Hitachi F-7000 spectrophotometer, a photoluminescence spectrometer, is used to obtain a photoluminescence (PL) spectrum of the quantum dots at an excitation wavelength of 450 nm, which shows that the quantum dots have an emission peak wavelength of 532 nm and thus emitted green light.

A Shimadzu ICPS-8100 mass spectrometer for inductively coupled plasma (ICP) mass spectroscopy is used to measure a weight of elements in the quantum dots, which is used to calculate an (atom) molar ratio of each element. The (atom) molar ratio of each element is used to calculate a core size of the quantum dots, a shell thickness, a size of the quantum dots, and a volume of the core relative to a total volume of the quantum dots.

Finally, the quantum dots are twice washed with acetone and ethanol, separated, dried for 12 hours under vacuum, and then, measured with respect to a weight. Subsequently, an appropriate amount, for example, about 10 μL of the quantum dots are dispersed in 990 μL of toluene and then, measured with respect to optical density (OD) according to a wavelength in a region of 350 nm to 600 nm in a cuvette with an optical path of 1 cm in an UV-Vis absorption spectroscope (Shimadzu UV-2600). Referring to the results, the quantum dots have OD of 0.458 of per 1 milligram (mg) of the quantum dots for a wavelength of 450 nm.

The (atom) molar ratio of elements in the quantum dots, the size of the quantum dots, the core size, the shell thickness, the volume of the core relative to a total volume of the quantum dots, the emission peak wavelength, and the optical density are shown in Table 1.

Example 2: Preparation and Analysis of InGaP/ZnS Quantum Dots (1) Preparation of InGaP Core 1-octadecene and oleylamine are mixed in a reaction flask and heated at 120° C. under vacuum. After 1 hour, an atmosphere of the reactor is converted into nitrogen. After heating the reactor to 300° C., a mixed solution of triethyl gallium, indium chloride, tris(trimethylsilyl)phosphine (TMS3P), and trioctylphosphine is rapidly injected thereinto and reacted for 10 minutes. A molar ratio of indium to gallium is set to be about 1:1, a molar ratio of zinc to a total amount of indium and gallium is about 3:1, and a molar ratio of oleylamine to the total amount of indium and gallium is about 9:1. After rapidly cooling the reaction solution to room temperature, acetone is added thereto, and precipitates obtained therefrom are centrifuged and dispersed again in toluene. The amount of TMS3P is 0.75 moles per 1 mole of the total amount of indium and gallium.

(2) Preparation of InGaP/ZnS Quantum Dots

The prepared InGaP semiconductor nanocrystal core is used in a similar manner to Example 1 to prepare InGaP/ZnS quantum dots. Specifically, zinc acetate, zinc fluoride, and oleic acid are dissolved in 1-octadecene in a reaction flask and vacuum-treated at 120° C. for 10 minutes. After internally substituting the flask with nitrogen ($N_2$), the solution is set at 220° C. The toluene dispersion of the prepared InGaP core, the S/TOP stock solution synthesized in Example 1, and oleylamine are injected to this solution and then, reacted for 70 minutes, while maintained at 220° C., obtaining a reaction solution including InGaP/ZnS quantum dots having an InGaP core and a ZnS shell disposed thereon.

(3) Analysis of Characteristics of Quantum Dots

An emission spectrum of the prepared InGaP/ZnS quantum dots and a weight of each element in the quantum dots are measured in the same method as in the (3) of Example 1. Referring to the measured emission spectrum, the quantum dots exhibit an emission peak wavelength of 534 nm, which means quantum dots emitting green light. The weight of each element of the quantum dots is used to calculate an (atom) molar ratio, which is used to calculate a size of the core of the quantum dots, a thickness of the shell, a size of the quantum dots, and a volume of the core, and the results are shown in Table 1. When the quantum dots are measured with respect to optical density in the same method as in Example 1, the quantum dots have OD of 0.564 per 1 mg at 450 nm.

Comparative Example 1: Preparation and Analysis of InP/ZnS Quantum Dots

InP/ZnS quantum dots including an InP semiconductor nanocrystal core and a ZnS semiconductor nanocrystal shell disposed on the core are prepared in the same manner as in Example 1 except that the S/TOP stock solution is twice as much as used in Example 1, and the InP semiconductor nanocrystal core, precursors for the shell coating (i.e., zinc acetate and zinc fluoride), oleic acid, oleamine, and the like are mixed at 220° C.

The prepared InP/ZnS quantum dots are measured with respect to an emission spectrum and a weight of each element in the same manner as in Example 1.

Referring to the measured emission spectrum, the quantum dots of Comparative Example 1 have an emission peak wavelength of 531 nm. The weight of each element in the quantum dots is used to calculate an (atomic) molar ratio of each element, a size of the core of the quantum dots, a thickness of the shell, a size of the quantum dots, and a volume of the core, and the results are shown in Table 1. The quantum dots are measured with respect to optical density in the same manner as in Example 1, wherein OD per 1 mg of the quantum dots (QDs) at 450 nm is 0.258.

TABLE 1

| | Core size (nm) | Shell thickness (nm) | Total QD size (nm) | Core Volume relative to Total QD Volume (%) | OD/mg @ 450 nm | PL (nm) | Molar amount of elements in QD, based on 1 mole of QD | | | | | Molar ratio of S:P |
|---|---|---|---|---|---|---|---|---|---|---|---|---|
| | | | | | | | P | S | Zr | Ga | In | |
| Ex. 1 | 2.47 | 0.83 | 4.12 | 21.5 | 0.458 | 532 | 0.060 | 0.348 | 0.517 | 0 | 0.075 | 5.8:1 |
| Ex. 2 | 2.80 | 0.95 | 4.70 | 21.3 | 0.564 | 534 | 0.060 | 0.330 | 0.470 | 0.019 | 0.051 | 5.5:1 |
| Comp. Ex. 1 | 2.50 | 1.34 | 5.17 | 11.3 | 0.258 | 531 | 0.034 | 0.389 | 0.538 | 0 | 0.039 | 11.4:1 |

As shown in Table 1, as in Examples 1 and 2, when the core has a volume of 20% or greater, based on a total volume of the quantum dot, the optical density increased to 0.4 or more per unit weight of the quantum dots at 450 nm. On the other hand, the quantum dot of Comparative Example 1 having a similar core size to that of Example 1 but a core volume relative to a total volume of the quantum dot of only 11.3% due to an increase in the shell thickness exhibits low optical density of 0.258 per unit weight at 450 nm, which is about ½ of that of Example 1.

Accordingly, the quantum dot according to an embodiment may significantly increase a blue light absorption, compared with the quantum dot according to the comparative example, and accordingly, when the quantum dots according to an embodiment are dispersed in a matrix and the like to prepare a quantum dot composite, the quantum dots according to an embodiment may be included much more per unit weight in the quantum dot composite. Accordingly, the blue light absorption of the quantum dot composite including the quantum dots according to an embodiment may be increased, realizing excellent light emitting characteristics.

Preparation Example 1: Preparation of Quantum Dot Polymer Composite and Pattern Thereof (1) Preparation of Quantum Dot-Binder Dispersion The quantum dots prepared in examples and comparative examples are dispersed in chloroform, preparing chloroform dispersion, and this chloroform dispersion is mixed with a binder (quaternary copolymer of methacrylic acid, benzyl methacrylate, hydroxyethyl methacrylate, and styrene, acid value: 130 milligrams of potassium hydroxide per gram (mg KOH/g), molecular weight: 8,000) solution (in propylene glycol monomethyl ether acetate at a concentration of 30 weight percent (wt %)), preparing quantum dot-binder dispersion.

(2) Preparation of Photosensitive Composition

A composition is prepared by adding hexaacrylate having the following structure as a photopolymerizable monomer, glycoldi-3-mercaptopropionate (hereinafter, 2T), an oxime ester compound as an initiator, TiO₂ as a light diffusing agent, and PGMEA to the quantum dot-binder dispersion.

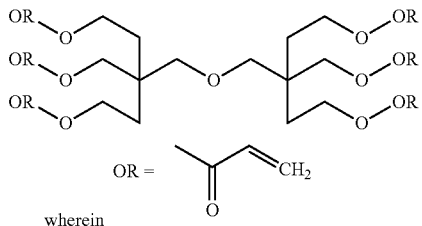

wherein

The composition includes 42 wt % of the quantum dots, 3 wt % of TiO₂, 25 wt % of 2T, 12 wt % of the photopolymerizable monomer, and 0.5 wt % of the initiator based on the total solid content (TSC), wherein the total solid content (TSC) is 25 wt %.

(3) Preparation and Analysis of Characteristics of Quantum Dot-Polymer Composite Pattern The photosensitive composition prepared in the (2) is spin-coated on a glass substrate at 150 revolutions per minute (rpm) for 5 seconds, obtaining a film. The film is prebaked (PRB) at 100° C. for 2 minutes. The prebaked film is irradiated with light (wavelength: 365 nm, intensity: 100 millijoules (mJ)) for 1 second under a mask having a predetermined pattern (e.g., square dot or stripe pattern) and post-baked (POB) at 180° C. for 30 minutes. Subsequently, the film is developed with a potassium hydroxide aqueous solution (concentration: 0.043%) for 50 seconds, obtaining a patterned quantum dot-polymer composite film (e.g., QD color filter (C/F) film) having a thickness of about 10 micrometers (μm).

The film is measured with respect to a photoluminescence spectrum (PL) for an excitation wavelength of 450 nm by using a Hitachi F-7000 spectrometer, from which an emission peak wavelength and a full width at half maximum (FWHM) are measured. The film is measured with respect to blue light absorption and light conversion efficiency by using a quantum efficiency-measuring system (Otsuka QE-2100, Otsuka Electronics Co., Ltd.).

Furthermore, the quantum dot-polymer composite film is dissolved in nitric acid, hydrobromic acid, or hydrofluoric acid into a solution and then, ICP analyzed to measure each element content.

Preparation Example 2: Manufacture of Display Panel

A display panel may be manufactured by applying the quantum dot composite according to Preparation Example 1 and the quantum dot composite including red quantum dots to a green pixel and a red pixel, respectively, in a color conversion panel, and applying a film including the other components except for the quantum dots to a light transmitting layer configured to transmit the excitation light, i.e., blue light.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
a core comprising a first semiconductor nanocrystal, and
a shell disposed on the core, the shell comprising a second semiconductor nanocrystal,
wherein the quantum dot comprises a metal comprising indium and zinc, and a non-metal comprising phosphorus and sulfur, and does not comprise cadmium, and
wherein the quantum dot has an optical density of about 0.4 to about 0.6 per 1 milligram of the quantum dot for a wavelength of 450 nanometers and an emission peak wavelength of greater than or equal to about 500 nanometers and less than or equal to about 550 nanometers, and a volume of the core is greater than or equal to about 20% and less than or equal to about 50%, based on a total volume of the quantum dot,
wherein the first semiconductor nanocrystal comprises indium and phosphorus and the second semiconductor nanocrystal comprises zinc and sulfur, and
wherein a molar ratio of the phosphorus to the sulfur in the quantum dot is about 1:1.0 to about 1:7.0.

2. The quantum dot of claim 1, wherein the volume of the core is greater than or equal to about 20% and less than or equal to about 35%, based on the total volume of the quantum dot.

3. The quantum dot of claim 1, wherein a molar ratio of phosphorus to sulfur in the quantum dot is about 1:2.0 to about 1:7.0.

4. The quantum dot of claim 1, wherein a molar ratio of indium to zinc in the quantum dot is about 1:3.0 to about 1:11.0.

5. The quantum dot of claim 1, wherein a molar ratio of indium to zinc in the quantum dot is about 1:5.0 to about 1:10.0.

6. The quantum dot of claim 1, wherein the first semiconductor nanocrystal further comprises gallium.

7. The quantum dot of claim 6, wherein the second semiconductor nanocrystal further comprises selenium.

8. The quantum dot of claim 1, wherein the second semiconductor nanocrystal further comprises selenium.

9. The quantum dot of claim 1, wherein the volume of the core is greater than or equal to about 21% and less than or equal to about 50%, based on the total volume of the quantum dot.

10. The quantum dot of claim 1, wherein the volume of the core is greater than or equal to about 21.3% and less than or equal to about 50%, based on the total volume of the quantum dot.

11. A quantum dot composition, comprising
a plurality of quantum dots of claim 1, and
a polymerizable monomer, a dispersant, a solvent, or a combination thereof.

12. The quantum dot composition of claim 11, wherein the quantum dot composition comprises the polymerizable monomer and the polymerizable monomer comprises a polymerizable compound comprising a carbon-carbon double bond, a compound comprising a thiol group, or a combination thereof.

13. The quantum dot composition of claim 11, wherein the quantum dot composition comprises the dispersant and the dispersant comprises a compound or polymer comprising a carboxyl group.

14. A quantum dot composite, comprising
a matrix, and
a plurality of quantum dots dispersed in the matrix, wherein the plurality of quantum dots comprises the quantum dot of claim 1.

15. A display panel, comprising
a color conversion layer comprising a plurality of regions comprising a color conversion region, wherein the quantum dot composite of claim 14 is disposed in the color conversion region.

16. The display panel of claim 15, wherein
the display panel further comprises a light emitting panel comprising a light emitting source,
the color conversion region comprises a first color conversion region configured to convert light emitted from the light emitting panel into light of a first emission spectrum, and
the first color conversion region comprises the quantum dot composite.

17. The display panel of claim 16, wherein the color conversion region further comprises a second color conversion region configured to convert light emitted from the light emitting panel into light having a second emission spectrum different from the first emission spectrum.

18. The display panel of claim 17, wherein the first emission spectrum is a green emission spectrum having an emission peak wavelength of from about 500 nanometers to about 550 nanometers, and the second emission spectrum is a red emission spectrum having an emission peak wavelength of from about 600 nanometers to about 650 nanometers.

19. An electronic device comprising the display panel of claim 15.

20. The electronic device of claim 19, wherein the electronic device is a display device.

* * * * *